(12) United States Patent
Lai et al.

(10) Patent No.: US 9,871,463 B2
(45) Date of Patent: Jan. 16, 2018

(54) POWER MODULE

(71) Applicant: Delta Electronics Int'l (Singapore) Pte Ltd, Singapore (SG)

(72) Inventors: Yiu-Wai Lai, Singapore (SG); Da-Jung Chen, Singapore (SG)

(73) Assignee: DELTA ELECTRONICS INT'L (SINGAPORE) PTE LTD, Singapore (SG)

( * ) Notice: Subject to any disclaimer, the term of this patent is extended or adjusted under 35 U.S.C. 154(b) by 0 days.

(21) Appl. No.: 15/165,863

(22) Filed: May 26, 2016

(65) Prior Publication Data

US 2016/0352246 A1 Dec. 1, 2016

(30) Foreign Application Priority Data

May 29, 2015 (SG) .......................... 10201504271Y

(51) Int. Cl.
*H02M 7/00* (2006.01)
*H05K 1/11* (2006.01)
*H05K 1/18* (2006.01)
*H05K 1/02* (2006.01)
*H01L 23/367* (2006.01)
(Continued)

(52) U.S. Cl.
CPC ............ *H02M 7/003* (2013.01); *H01L 23/36* (2013.01); *H01L 23/3735* (2013.01); *H01L 23/5384* (2013.01); *H01L 23/5389* (2013.01); *H01L 24/18* (2013.01); *H01L 25/115* (2013.01); *H01L 25/18* (2013.01); *H05K 1/0206* (2013.01); *H05K 7/209* (2013.01); *H01L 2224/18* (2013.01); *H05K 1/0207* (2013.01); *H05K 2201/066* (2013.01); *H05K 2201/10053* (2013.01); *H05K 2201/10166* (2013.01); *H05K 2201/10174* (2013.01); *H05K 2201/10416* (2013.01)

(58) Field of Classification Search
CPC ....... H01L 23/5389; H01L 2224/24137; H01L 2224/24145
See application file for complete search history.

(56) References Cited

U.S. PATENT DOCUMENTS 7,042,074 B2 * 5/2006 Gobl ................... H01L 23/5387
257/678
7,466,020 B2 * 12/2008 Eckardt ............... H01L 23/5389
257/686

(Continued)

*Primary Examiner* — Robert J Hoffberg
(74) *Attorney, Agent, or Firm* — Kirton McConkie; Evan R. Witt

(57) ABSTRACT

A power module includes a substrate, a first sub-module and a second sub-module. The substrate includes plural first conducting parts, plural second conducting parts and a third conducting part. The first sub-module is disposed on the substrate, and includes a first semiconductor switch, a first diode, a first electrode, a second electrode and a third electrode. The first electrode and the second electrode are electrically connected with the corresponding first conducting parts. The third electrode is electrically connected with the third conducting part. The second sub-module is disposed on the substrate, and includes a second semiconductor switch, a second diode, a fourth electrode, a fifth electrode and a sixth electrode. The fourth electrode and the fifth electrode are electrically connected with the corresponding second conducting parts. The sixth electrode is electrically connected with the third conducting part.

18 Claims, 18 Drawing Sheets

(51) Int. Cl.
*H01L 23/373* (2006.01)
*H01L 23/48* (2006.01)
*H05K 7/20* (2006.01)
*H01L 25/18* (2006.01)
*H01L 23/36* (2006.01)
*H01L 23/538* (2006.01)
*H01L 23/00* (2006.01)
*H01L 25/11* (2006.01)

(56) References Cited

U.S. PATENT DOCUMENTS

| | | | |
|---|---|---|---|
| 8,514,579 B2 * | 8/2013 | Stolze | H01L 23/3121 |
| | | | 257/678 |
| 8,547,697 B2 * | 10/2013 | Fukutani | H01L 25/072 |
| | | | 165/80.4 |
| 8,691,631 B2 * | 4/2014 | Otremba | H01L 23/5389 |
| | | | 257/666 |
| 9,107,290 B1 * | 8/2015 | Chen | H05K 3/0061 |
| 9,287,231 B2 * | 3/2016 | Chen | H01L 24/32 |
| 9,425,131 B2 * | 8/2016 | Chen | H01L 23/49568 |
| 9,673,156 B2 * | 6/2017 | Lai | H01L 24/02 |
| 2007/0246812 A1 | 10/2007 | Zhuang | |
| 2010/0078783 A1 | 4/2010 | Otremba | |
| 2012/0235162 A1 * | 9/2012 | Isobe | H01L 23/467 |
| | | | 257/77 |
| 2015/0054159 A1 | 2/2015 | Hoegerl et al. | |
| 2016/0351478 A1 * | 12/2016 | Lai | H01L 23/5389 |
| 2017/0110978 A1 * | 4/2017 | Lai | H02M 7/003 |

* cited by examiner

_US 9,871,463 B2_

1

POWER MODULE

FIELD OF THE INVENTION

The present invention relates to a power module, and more particularly to a power module for a power inverter.

BACKGROUND OF THE INVENTION

Recently, the general trends in designing power converters are toward high efficiency and high density. The high efficiency power converter can reduce the power loss and achieve the power-saving purpose. The high density power converter can reduce the overall volume of the electronic product and meet the requirements of small size and light weightiness.

Generally, a power converter comprises a bridge circuit for rectification. The bridge circuit comprises at least one high-voltage-side switching element and at least one low-voltage-side switching element. For example, a three-phase bridge circuit of a three-phase power converter comprises three high-voltage-side switching elements and three low-voltage-side switching elements. The high-voltage-side switching elements are connected with the corresponding low-voltage-side switching elements in series. Each of the high-voltage-side switching elements and the low-voltage-side switching elements comprises a semiconductor switch and a diode, which are connected with each other in parallel. For example, the semiconductor switch is an insulated-gate bipolar transistor (IGBT). By alternately turning on and turning off the semiconductor switch, the bridge circuit can rectify the input power. When the semiconductor switch is turned off, the diode allows the current to continuously flow.

A conventional method of fabricating the bridge circuit of the power converter will be illustrated as follows. Firstly, the semiconductor switches and the diodes of the high-voltage-side switching elements and the semiconductor switches and the diodes of the low-voltage-side switching elements are disposed on a substrate. Then, the semiconductor switches and the diodes of the high-voltage-side switching elements and the semiconductor switches and the diodes of the low-voltage-side switching elements are connected with each other and/or connected with an external component by a wire-bonded technology (e.g. through aluminum wires or copper wires). Afterwards, the above structure is packaged by an encapsulation material.

However, since the high-voltage-side switching elements and the low-voltage-side switching elements are connected with each other by the wire-bonded technology, some drawbacks occur. For example, the long wires for connecting the high-voltage-side switching elements and the low-voltage-side switching elements may increase the parasitic inductance between the wires and the substrate. Under this circumstance, the switching efficiency of the high-voltage-side switching elements and the low-voltage-side switching elements will be adversely affected. Moreover, since the long wire has a large impedance value, the power conversion efficiency is impaired. Moreover, the side of the substrate for wire-bonding the high-voltage-side switching elements and the low-voltage-side switching elements cannot be equipped with any heat dissipation device. Since the substrate is only able to dissipate away heat in a single direction, the heat dissipating efficiency is insufficient. Moreover, since it is necessary to retain a wire-bonded area on the substrate, the space utilization of the substrate is limited. Under this circumstance, it is difficult to increase the power density. Moreover, the high-voltage-side switching elements and the low-voltage-side switching elements of the bridge circuit are packaged after being mounted on the substrate. After the bridge circuit is fabricated, if one component of the high-voltage-side switching element or the low-voltage-side switching element has malfunction, the damaged component cannot be replaced with a new one. Under this circumstance, the whole bridge circuit cannot be used again.

Therefore, there is a need of providing an improved power module so as to overcome the above drawbacks.

SUMMARY OF THE INVENTION

An object of the present invention provides a power module with semiconductor switches and diodes embedded within insulation layers. Consequently, a first sub-module and a second sub-module are formed as a high-voltage-side switching element and a low-voltage-side switching element of a bridge circuit. The high-voltage-side switching element and the low-voltage-side switching element are disposed on a substrate and electrically connected with corresponding conducting parts of the substrate. Consequently the power module of the present invention has reduced parasitic inductance, increased switching efficiency, reduced impedance and increased power conversion efficiency. Moreover, since it is not necessary to retain a wire-bonded area on the substrate, the space utilization of the substrate is increased. Under this circumstance, the power density is enhanced.

Another object of the present invention provides a power module with a first sub-module and a second sub-module. Moreover, a first semiconductor switch and a first diode of a high-voltage-side switching element are directly embedded within the substrate and packaged as the first sub-module, and the second sub-module (i.e. the low-voltage-side switching element) is disposed on the first sub-module. Since the second sub-module and the first sub-module are located at different levels, the connection distance between the high-voltage-side switching element and the low-voltage-side switching element is effectively shortened. Under this circumstance, the on-resistance is effectively reduced, the parasitic effect is reduced, the electrical property is enhanced, and the overall power density of the power module is increased.

In accordance with an aspect of the present invention, there is provided a power module. The power module includes a substrate, at least one first sub-module and at least one second sub-module. The substrate includes plural first conducting parts, plural second conducting parts and at least one third conducting part. The at least one first sub-module is disposed on the substrate. The first sub-module includes a first semiconductor switch, a first diode, a first electrode, a second electrode and a third electrode. The first semiconductor switch includes plural first conducting terminals, and the first diode includes plural second conducting terminals. The first electrode and the third electrode are electrically connected with the corresponding first conducting terminals of the first semiconductor switch and electrically connected with the corresponding second conducting terminals of the first diode. The second electrode is electrically connected with the corresponding first conducting terminal. The first electrode and the second electrode are contacted with the corresponding first conducting parts. The third electrode is contacted with the third conducting part. The at least one second sub-module is disposed on the substrate. The second sub-module includes a second semiconductor switch, a second diode, a fourth electrode, a fifth electrode and a sixth electrode. The second semiconductor switch includes plural third conducting terminals. The second diode includes plural fourth conducting terminals. The fourth electrode and the sixth electrode are electrically connected with the corresponding third conducting terminals of the second semiconductor switch and electrically connected with the corresponding fourth conducting terminals of the second diode. The fifth electrode is electrically connected with the corresponding third conducting terminal. The fourth electrode and the fifth electrode are contacted with the corresponding second conducting parts. The sixth electrode is contacted with the third conducting part.

In accordance with another aspect of the present invention, there is provided a power module. The power module includes a first sub-module and at least one second sub-module. The first sub-module includes at least one first semiconductor switch, at least one first diode, a first electrode, at least one second electrode, at least one third electrode, at least one first lead electrode, at least one second lead electrode and a substrate. The at least one first semiconductor switch and the at least one first diode are embedded within the substrate. Each first semiconductor switch comprises plural first conducting terminals. Each first diode comprises plural second conducting terminals. The first electrode is electrically connected with the corresponding first conducting terminal of the at least one first semiconductor switch and the corresponding second conducting terminal of the at least one first diode. The third electrode is electrically connected with the corresponding first conducting terminal of the at least one first semiconductor switch and the corresponding second conducting terminal of the at least one first diode. The second electrode is electrically connected with the corresponding first conducting terminal of the at least one first semiconductor switch. The at least one second sub-module is disposed on the first sub-module. The second sub-module includes a second semiconductor switch, a second diode, a fourth electrode, a fifth electrode and a sixth electrode. The second semiconductor switch includes plural third conducting terminals. The second diode includes plural fourth conducting terminals. The fourth electrode and the sixth electrode are electrically connected with the corresponding third conducting terminals of the second semiconductor switch and electrically connected with the corresponding fourth conducting terminals of the second diode. The fifth electrode is electrically connected with the corresponding third conducting terminal of the second semiconductor switch. The fourth electrode of the second sub-module is electrically connected with the corresponding first lead electrode of the first sub-module. The fifth electrode of the second sub-module is electrically connected with the corresponding second lead electrode of the first sub-module. The sixth electrode of the second sub-module is electrically connected with the corresponding third electrode of the first sub-module.

In accordance with a further aspect of the present invention, there is provided a power module. The power module includes a first sub-module and a second sub-module. The first sub-module includes plural first semiconductor switches, plural first diodes, a first electrode, plural second electrodes, plural third electrodes, plural first lead electrodes, plural second lead electrodes and a substrate. The plural first semiconductor switches and the plural first diodes are embedded within the substrate. Each first semiconductor switch includes plural first conducting terminals. Each first diode includes plural second conducting terminals. The first electrode is electrically connected with the corresponding first conducting terminals of the first semiconductor switches and the corresponding second conducting terminals of the first diode. Each third electrode is electrically connected with the corresponding first conducting terminal of the corresponding first semiconductor switch and the corresponding second conducting terminal of the corresponding first diode. Each second electrode is electrically connected with the corresponding first conducting terminal of the corresponding first semiconductor switch. The second sub-module is disposed on the first sub-module, and includes plural second semiconductor switches, plural second diodes, plural fourth electrodes, plural fifth electrodes and plural sixth electrodes. Each second semiconductor switch includes plural third conducting terminals. Each second diode includes plural fourth conducting terminals. Each fourth electrode and the corresponding sixth electrode are electrically connected with the corresponding third conducting terminals of corresponding second semiconductor switch and electrically connected with the corresponding fourth conducting terminals of the corresponding second diode. Each fifth electrode is electrically connected with the corresponding third conducting terminal of the corresponding second semiconductor switch. Each fourth electrode of the second sub-module is electrically connected with the corresponding first lead electrode of the first sub-module. Each fifth electrode of the second sub-module is electrically connected with the corresponding second lead electrode of the first sub-module. Each sixth electrode of the second sub-module is electrically connected with the corresponding third electrode of the first sub-module.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
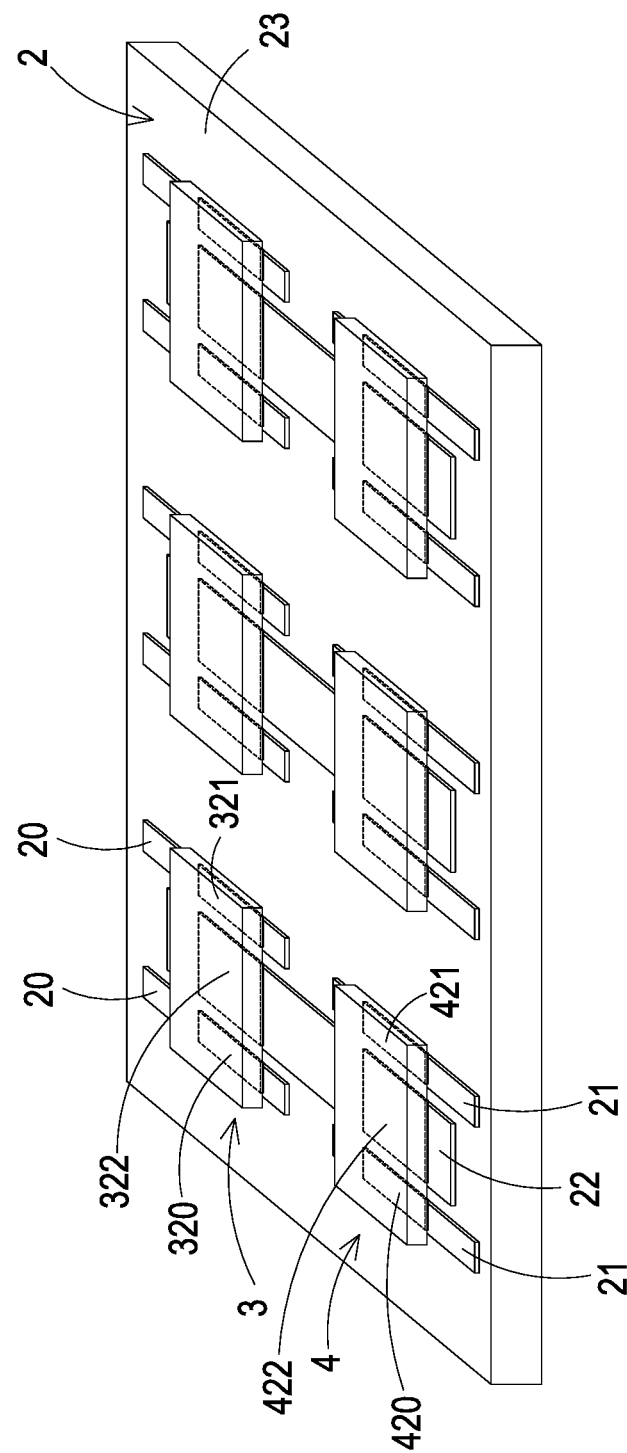
FIG. 1 is a schematic perspective view illustrating a power module according to a first embodiment of the present invention.
Figure 2:
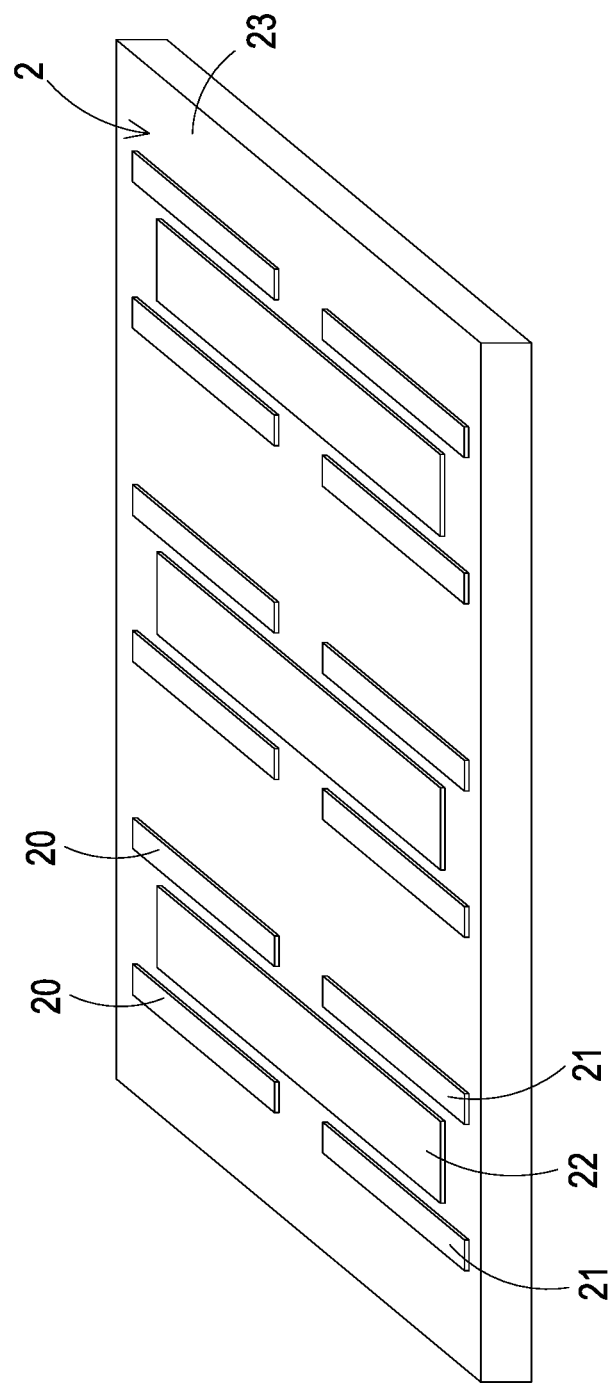
FIG. 2 is a schematic perspective view illustrating a substrate of the power module of FIG. 1.

FIG. 1 is a schematic perspective view illustrating a power module according to a first embodiment of the present invention. FIG. 2 is a schematic perspective view illustrating a substrate of the power module of FIG. 1. Please refer to FIGS. 1 and 2. The power module 1 comprises a substrate 2, at least one first sub-module 3 and at least one second sub-module 4. Moreover, plural first conducting parts 20, plural second conducting parts 21 and at least one third conducting part 22 are formed on a first surface 23 of the substrate 2.

In this embodiment, two first conducting parts 20 are located at an upper left side and an upper right side of the third conducting part 22, respectively. Moreover, two second conducting parts 21 are located at a lower left side and a lower right side of the third conducting part 22, respectively. Moreover, the first conducting parts 20, the second conducting parts 21 and the third conducting part 22 are made of electrically conductive material (e.g. copper).

The first sub-module 3 is disposed on the first surface 23 of the substrate 2. Moreover, the first sub-module 3 comprises a first semiconductor switch 30 (see FIG. 4), a first diode 31 (see FIG. 4), a first electrode 320, a second electrode 321 and a third electrode 322. The first semiconductor switch 30 comprises plural first conducting terminals 300. The first diode 31 comprises plural second conducting terminals 310. The first electrode 320 and the third electrode 322 are electrically connected with the corresponding first conducting terminals 300 of the first semiconductor switch 30. The first electrode 320 and the third electrode 322 are also electrically connected with the corresponding second conducting terminals 310 of the first diode 31. The second electrode 321 is electrically connected with the corresponding first conducting terminal 300 of the first semiconductor switch 30. When the first sub-module 3 is placed on the substrate 2, the first electrode 320 and the second electrode 321 are disposed on and electrically connected with the corresponding first conducting parts 20, and the third electrode 322 is disposed on and electrically connected with the third conducting part 22.

The third electrode 322 is arranged between the first electrode 320 and the second electrode 321. In an embodiment, the first semiconductor switch 30 is an insulated-gate bipolar transistor (IGBT). Consequently, the first semiconductor switch 30 comprises three first conducting terminals 300. The three first conducting terminals 300 serve as a gate, an emitter and a collector, respectively. The first electrode 320 is electrically connected with the collector. The second electrode 321 is electrically connected with the gate. The third electrode 322 is electrically connected with the emitter.

The second sub-module 4 is disposed on the first surface 23 of the substrate 2. Moreover, the second sub-module 4 comprises a second semiconductor switch 40 (see FIG. 5), a second diode 41 (see FIG. 5), a fourth electrode 420, a fifth electrode 421 and a sixth electrode 422. The second semiconductor switch 40 comprises plural third conducting terminals 400. The second diode 41 comprises plural fourth conducting terminals 410. The fourth electrode 420 and the sixth electrode 422 are electrically connected with the corresponding third conducting terminals 400 of the second semiconductor switch 40. The fourth electrode 420 and the sixth electrode 422 are electrically connected with the corresponding fourth conducting terminals 410 of the second diode 41. The fifth electrode 421 is electrically connected with the corresponding third conducting terminal 400 of the second semiconductor switch 40. When the second sub-module 4 is placed on the substrate 2, the fourth electrode 420 and the fifth electrode 421 are disposed on and electrically connected with the corresponding second conducting parts 21, and the sixth electrode 422 is disposed on and electrically connected with the third conducting part 22.

The sixth electrode 422 is arranged between the fourth electrode 420 and the fifth electrode 421. In an embodiment, the second semiconductor switch 40 is an insulated-gate bipolar transistor (IGBT). Consequently, the second semiconductor switch 40 comprises three third conducting terminals 400. The three third conducting terminals 400 serve as a gate, an emitter and a collector, respectively. The fourth electrode 420 is electrically connected with the emitter. The fifth electrode 421 is electrically connected with the gate. The sixth electrode 422 is electrically connected with the collector.

Figure 3:
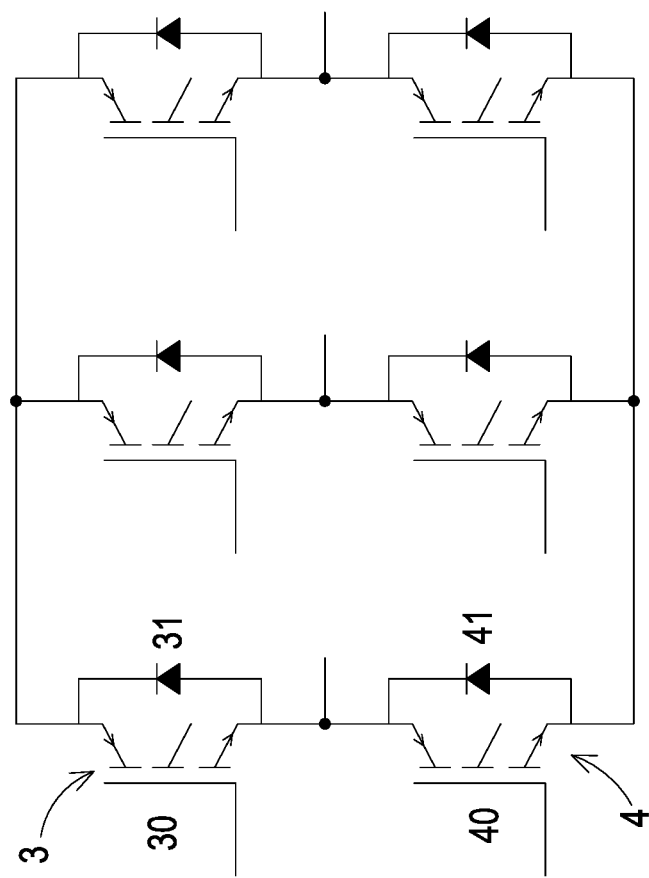
FIG. 3 is a schematic circuit diagram illustrating a three-phase bridge circuit of a three-phase power converter with the power module of FIG. 1.

FIG. 3 is a schematic circuit diagram illustrating a three-phase bridge circuit of a three-phase power converter with the power module of FIG. 1. In case that the power module 1 is applied to the three-phase power converter, the power module 1 comprises three first sub-modules 3 and three second sub-modules 4. Each first sub-module 3 and the corresponding second sub-module 4 are collaboratively formed as one leg of the three-phase bridge circuit. Moreover, the first sub-module 3 is formed as a high-voltage-side switching element, and the second sub-module 4 is formed as a low-voltage-side switching element. In each leg of the bridge circuit, the emitter of the high-voltage-side switching element is electrically connected with the collector of the low-voltage-side switching element. Moreover, as mentioned above, the third electrode 322 of the first sub-module 3 and the sixth electrode 422 of the second sub-module 4 are contacted with the third conducting part 22, the third electrode 322 is electrically connected with the emitter of the first semiconductor switch 30, and the sixth electrode 422 is electrically connected with the collector of the second semiconductor switch 40. In other words, the emitter of the high-voltage-side switching element (i.e. the first sub-module 3) is electrically connected with the collector of the low-voltage-side switching element (i.e. the second sub-module 4).

Figure 4:
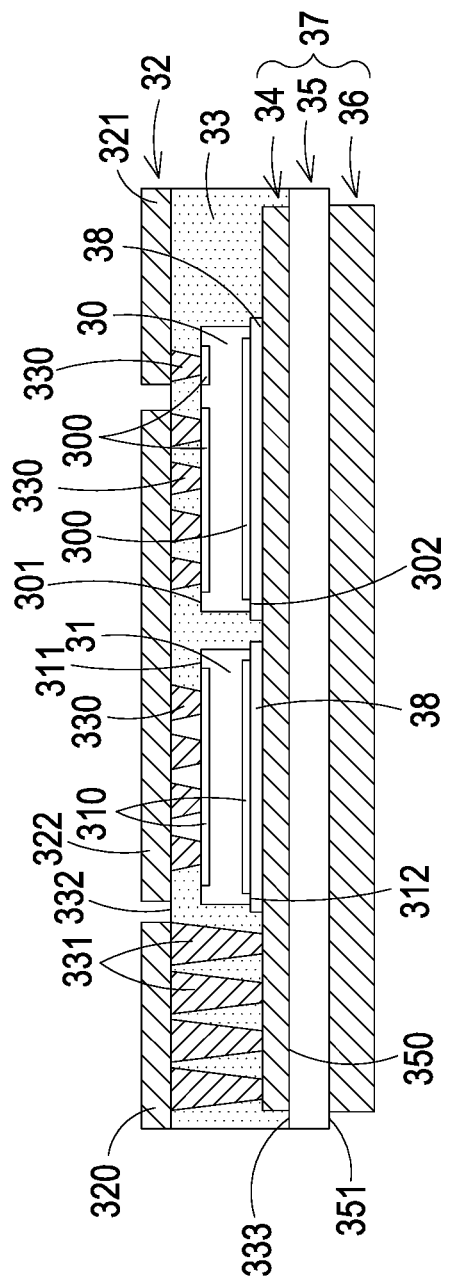
FIG. 4 is a schematic cross-sectional view illustrating an exemplary first sub-module of the power module of FIG. 1.
Figure 5:
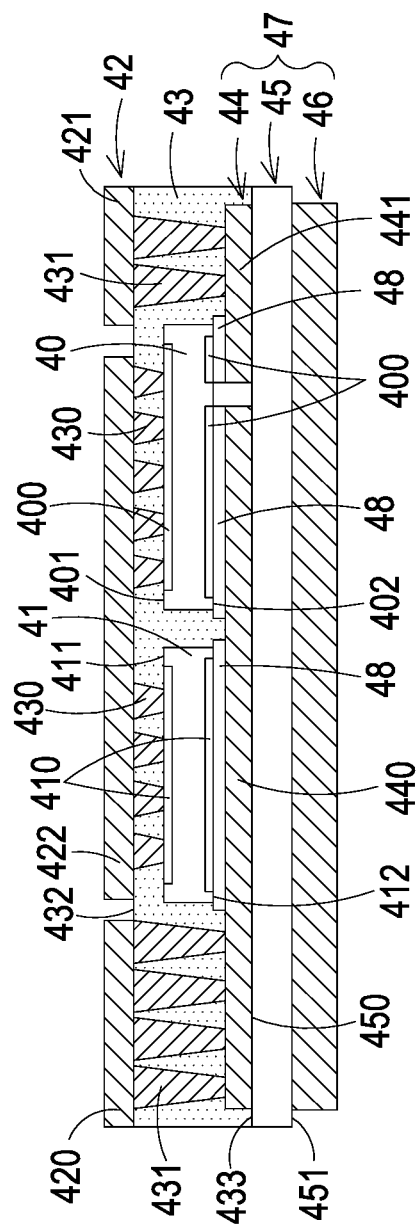
FIG. 5 is a schematic cross-sectional view illustrating an exemplary second sub-module of the power module of FIG. 1.

FIG. 4 is a schematic cross-sectional view illustrating an exemplary first sub-module of the power module of FIG. 1. FIG. 5 is a schematic cross-sectional view illustrating an exemplary second sub-module of the power module of FIG. 1. As shown in FIGS. 4 and 5, the first sub-module 3 comprises the first semiconductor switch 30, the first diode 31, a first conductive layer 32, a first insulation layer 33, a second conductive layer 34, a second insulation layer 35 and a third conductive layer 36.

Moreover, plural first conductive vias 330 and plural second conductive vias 331 are formed in the first insulation layer 33. The first conductive layer 32 is disposed on a top surface 332 of the first insulation layer 33. The first conductive layer 32 is divided into the first electrode 320, the second electrode 321 and the third electrode 322 by an etching process. The first electrode 320 is contacted with first ends of the plural second conductive vias 331. The second electrode 321 and the third electrode 322 are contacted with first ends of the corresponding first conductive vias 330.

The second conductive layer 34, the second insulation layer 35 and the third conductive layer 36 are collaboratively defined as a direct bond copper (DBC) assembly 37. The second insulation layer 35 is disposed on a bottom surface 333 of the first insulation layer 33 and exposed outside the first insulation layer 33. The second conductive layer 34 is disposed on a top surface 350 of the second insulation layer 35 and embedded within the first insulation layer 33. The second conductive layer 34 is further contacted with second ends of the plural second conductive vias 331. Moreover, the second conductive layer 34 is electrically connected with the first electrode 320 through the plural second conductive vias 331. The third conductive layer 36 is disposed on a bottom surface 351 of the second insulation layer 35. That is, the second conductive layer 34 and the third conductive layer 36 are located at two opposite sides of the second insulation layer 35.

The first semiconductor switch 30 is embedded within the first insulation layer 33. The first conducting terminals 300 serving as the gate of the first semiconductor switch 30 and the first conducting terminals 300 serving as the emitter of the first semiconductor switch 30 are disposed on a top surface 301 of the first semiconductor switch 30. The first conducting terminal 300 serving as the collector of the first semiconductor switch 30 is disposed on a bottom surface 302 of the first semiconductor switch 30. Moreover, the gate of the first semiconductor switch 30 is contacted with a second end of the corresponding first conductive via 330 so as to be electrically connected with the second electrode 321. The emitter of the first semiconductor switch 30 is contacted with the second ends of the corresponding first conductive vias 330 so as to be electrically connected with the third electrode 322. The collector of the first semiconductor switch 30 is disposed on and electrically connected with the second conductive layer 34. Moreover, the collector of the first semiconductor switch 30 is electrically connected with the first electrode 320 through the second conductive layer 34 and the plural second conductive vias 331. Moreover, the first semiconductor switch 30 is attached on the second conductive layer 34 through a fixing material 38.

Similarly, the first diode 31 is embedded within the first insulation layer 33. Moreover, the first diode 31 may be attached on the second conductive layer 34 through the fixing material 38. The second conducting terminal 310 on a top surface 311 of the first diode 31 serves as an anode. Moreover, the anode of the first diode 31 is contacted with the second ends of the corresponding first conductive vias 330 so as to be electrically connected with the third electrode 322. The second conducting terminal 310 on a bottom surface 312 of the first diode 31 serves as a cathode. Moreover, the cathode of the first diode 31 is disposed on the second conductive layer 34 and electrically connected with the first electrode 320 through the second conductive layer 34 and the plural second conductive vias 331.

The second sub-module 4 comprises the second semiconductor switch 40, the second diode 41, a fourth conductive layer 42, a third insulation layer 43, a fifth conductive layer 44, a fourth insulation layer 45 and a sixth conductive layer 46.

Moreover, plural third conductive vias 430 and plural fourth conductive vias 431 are formed in the third insulation layer 43. The fourth conductive layer 42 is disposed on a top surface 432 of the third insulation layer 43. The fourth conductive layer 42 is divided into the fourth electrode 420, the fifth electrode 421 and the sixth electrode 422 by an etching process. The sixth electrode 422 is contacted with first ends of the plural third conductive vias 430. The fourth electrode 420 and the fifth electrode 421 are contacted with first ends of the corresponding fourth conductive vias 431.

The fifth conductive layer 44, the fourth insulation layer 45 and the sixth conductive layer 46 are collaboratively defined as a direct bond copper (DBC) assembly 47. The fourth insulation layer 45 is disposed on a bottom surface 433 of the third insulation layer 43 and exposed outside the third insulation layer 43. The fifth conductive layer 44 is disposed on a top surface 450 of the fourth insulation layer 45 and embedded within the third insulation layer 43. The fifth conductive layer 44 is further contacted with second ends of the plural fourth conductive vias 431. Moreover, the fifth conductive layer 44 is electrically connected with the fourth electrode 420 and the fifth electrode 421 through the plural fourth conductive vias 431. The sixth conductive layer 46 is disposed on a bottom surface 451 of the fourth insulation layer 45.

Moreover, by an etching process, the fifth conductive layer 44 is divided into a first conductive block 440 and a second conductive block 441. The first conductive block 440 is contacted with the corresponding fourth conductive vias 431 so as to be electrically connected with the fourth electrode 420. The second conductive block 441 is contacted with the corresponding fourth conductive vias 431 so as to be electrically connected with the fifth electrode 421.

The second semiconductor switch 40 is embedded within the third insulation layer 43. The third conducting terminals 400 serving as the gate and the emitter of the second semiconductor switch 40 are disposed on a bottom surface 402 of the second semiconductor switch 40. The third conducting terminal 400 serving as the collector is disposed on a top surface 401 of the second semiconductor switch 40. The collector of the second semiconductor switch 40 is contacted with the second ends of the corresponding third conductive vias 430 so as to be electrically connected with the sixth electrode 422. The emitter of the second semiconductor switch 40 is disposed on and electrically connected with the first conductive block 440, and electrically connected with the fourth electrode 420 through the first conductive block 440 and the corresponding fourth conductive vias 431. The gate of the second semiconductor switch 40 is disposed on and electrically connected with the second conductive block 441, and electrically connected with the fifth electrode 421 through the second conductive block 441 and the corresponding fourth conductive vias 431. Moreover, the second semiconductor switch 40 is attached on the fifth conductive layer 44 through a fixing material 48.

Similarly, the second diode 41 is embedded within the third insulation layer 43. Moreover, the second diode 41 may be attached on the fifth conductive layer 44 through the fixing material 48. The fourth conducting terminal 410 on a top surface 411 of the second diode 41 serves as a cathode. Moreover, the cathode of the second diode 41 is contacted with the second ends of the corresponding third conductive vias 430 so as to be electrically connected with the sixth electrode 422. The fourth conducting terminal 410 on a bottom surface 412 of the second diode 41 serves as an anode. Moreover, the anode of the second diode 41 is disposed on and electrically connected with the first conductive block 440, and electrically connected with the fourth electrode 420 through the first conductive block 440 and the corresponding fourth conductive vias 431.

In an embodiment, the first insulation layer 33 and the third insulation layer 43 are made of resin, Ajinomoto build-up film (ABF), prepreg material, molding compound, epoxy material, epoxy with filler or any other appropriate insulation material with high thermal conductivity. The first conductive layer 32, the second conductive layer 34, the third conductive layer 36, the fourth conductive layer 42, the fifth conductive layer 44 and the sixth conductive layer 46 are made of electrically conductive material (e.g. copper). The second insulation layer 35 and the fourth insulation layer 45 are made of insulation material with high thermal conductivity (e.g. ceramic material).

As shown in FIGS. 4 and 5, the configurations of the first semiconductor switch 30 and the second semiconductor switch 40 are similar, and the configurations of the first diode 31 and the second diode 41 are similar. The first semiconductor switch 30 within the first insulation layer 33 and the second semiconductor switch 40 within the third insulation layer 43 are inverted relative to each other. Moreover, the first diode 31 within the first insulation layer 33 and the second diode 41 within the third insulation layer 43 are inverted relative to each other.

From the above descriptions, the first semiconductor switch 30 and the first diode 31 are embedded within the first insulation layer 33 and packaged as the first sub-module 3, and the second semiconductor switch 40 and the second diode 41 are embedded within the third insulation layer 43 and packaged as the second sub-module 4. Moreover, the first sub-module 3 is formed as the high-voltage-side switching element, and the second sub-module 4 is formed as the low-voltage-side switching element. The plural first conducting terminals 300 of the first semiconductor switch 30 and the plural second conducting terminals 310 of the first diode 31 are electrically contacted with the corresponding electrodes of the first electrode 320, the second electrode 321 and the third electrode 322 of the first sub-module 3. The plural third conducting terminals 400 of the second semiconductor switch 40 and the plural fourth conducting terminals 410 of the second diode 41 are electrically contacted with the corresponding electrodes of the fourth electrode 420, the fifth electrode 421 and the sixth electrode 422 of the second sub-module 4. When the first sub-module 3 and the second sub-module 4 are disposed on the substrate 2, the first electrode 320, the second electrode 321 and the third electrode 322 of the first sub-module 3 and the fourth electrode 420, the fifth electrode 421 and the sixth electrode 422 of the second sub-module 4 are contacted with corresponding conducting parts of the first conducting parts 20, the second conducting parts 21 and the third conducting part 22. Consequently, the first sub-module 3 and the second sub-module 4 may be electrically connected with each other and/or electrically connected with other electronic components through first conducting parts 20, the second conducting parts 21 and the third conducting part 22 on the substrate 2. In comparison with the conventional method of connecting the high-voltage-side switching element and the low-voltage-side switching element of the conventional bridge circuit by the wire-bonded technology, the power module 1 of the present invention has reduced parasitic inductance, increased switching efficiency, reduced impedance and increased power conversion efficiency. Moreover, since it is not necessary to retain a wire-bonded area on the substrate 2, the space utilization of the substrate is increased. Under this circumstance, the power density is enhanced. Moreover, since the first sub-module 3 and the second sub-module 4 are independently formed as the high-voltage-side switching elements and the low-voltage-side switching element, if the first sub-module 3 or the second sub-module 4 has malfunction, the damaged sub-module may be replaced with a new one. After the damaged sub-module is replaced, the bridge circuit with the first sub-module 3 and the second sub-module 4 can be normally operated.

It is noted that numerous modifications and alterations of the first sub-module 3 and the second sub-module 4 may be made while retaining the teachings of the invention. Hereinafter, some variant examples of the first sub-module 3 and the second sub-module 4 will be illustrated with reference to FIGS. 6-9. Component parts and elements corresponding to those of the first embodiment are designated by identical numeral references, and detailed descriptions thereof are omitted.

Figure 6:
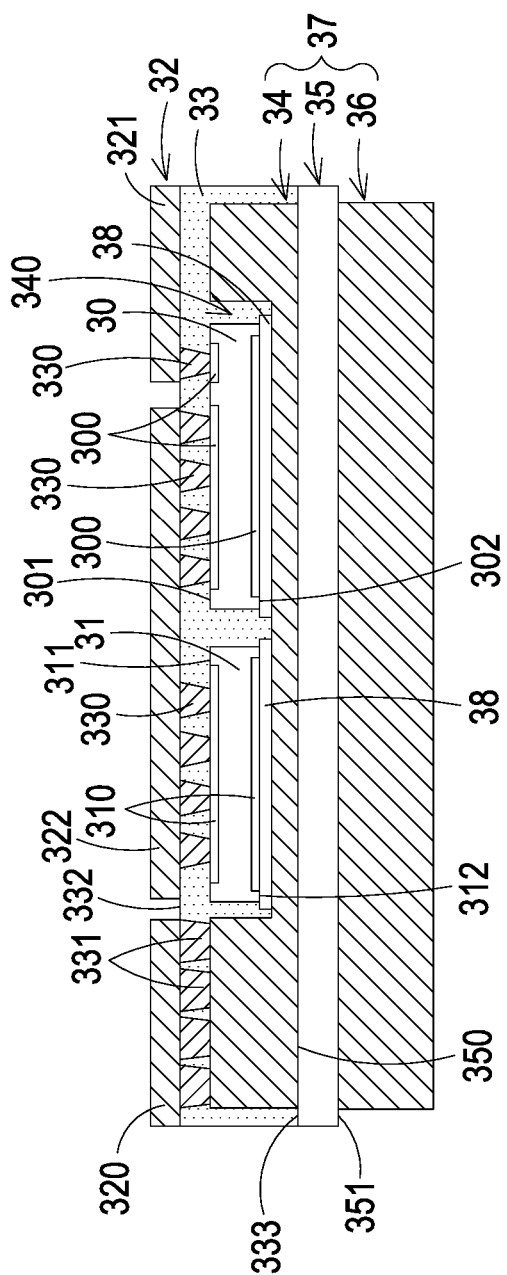
FIG. 6 is a schematic cross-sectional view illustrating another exemplary first sub-module of the power module of FIG. 1.
Figure 7:
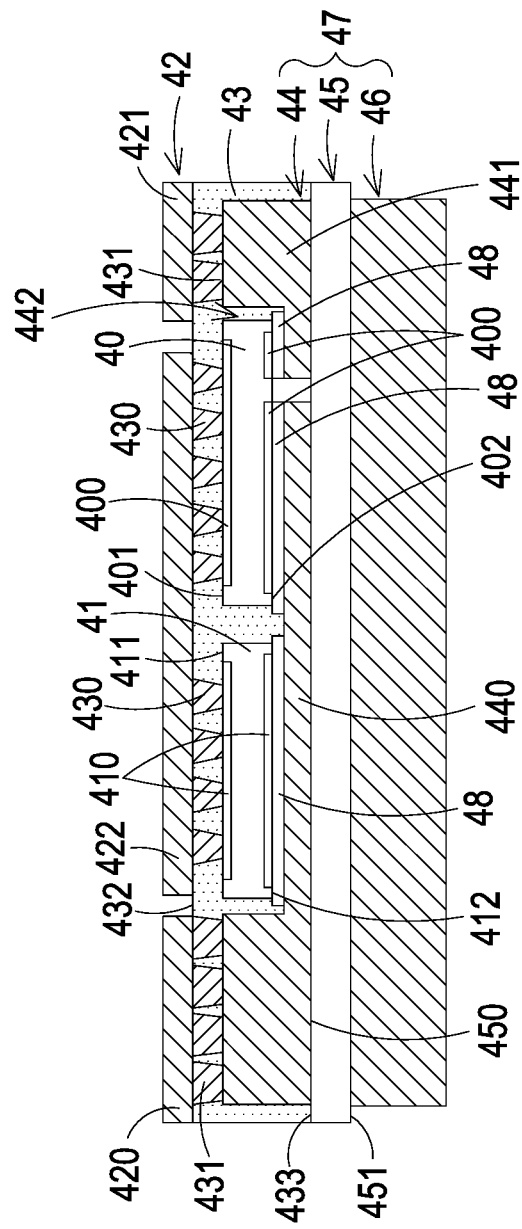
FIG. 7 is a schematic cross-sectional view illustrating another exemplary second sub-module of the power module of FIG. 1.

FIG. 6 is a schematic cross-sectional view illustrating another exemplary first sub-module of the power module of FIG. 1. FIG. 7 is a schematic cross-sectional view illustrating another exemplary second sub-module of the power module of FIG. 1. In comparison with the first sub-module 3 of FIG. 4 and the second sub-module 4 of FIG. 5, the second conductive layer 34 of the first sub-module 6 of this embodiment further comprises a first cavity 340, and the fifth conductive layer 44 of the second sub-module 7 of this embodiment further comprises a second cavity 442. Each of the first cavity 340 and the second cavity 442 may be formed by etching processes. The first cavity 340 is concavely formed in a top surface of the second conductive layer 34. Moreover, the first semiconductor switch 30 and the first diode 31 are accommodated within the first cavity 340. The second cavity 442 is concavely formed in a top surface of the fifth conductive layer 44. Moreover, the second semiconductor switch 40 and the second diode 41 are accommodated within the second cavity 442. Consequently, the sizes of the first semiconductor switch 30 and the first diode 31 embedded within the first insulation layer 33 or the sizes of the second semiconductor switch 40 and the second diode 41 embedded within the third insulation layer 43 may be increased.

Preferably but not exclusively, in case that the first semiconductor switch 30 and the first diode 31 are accommodated within the first cavity 340, the top surface 301 of the first semiconductor switch 30 and the top surface 311 of the first diode 31 are at the same level with the top surface of the second conductive layer 34. Similarly, in case that the second semiconductor switch 40 and the second diode 41 are accommodated within the second cavity 442, the top surface 401 of the second semiconductor switch 40 and the top surface 411 of the second diode 41 are at the same level with the top surface of the fifth conductive layer 44.

Figure 8:
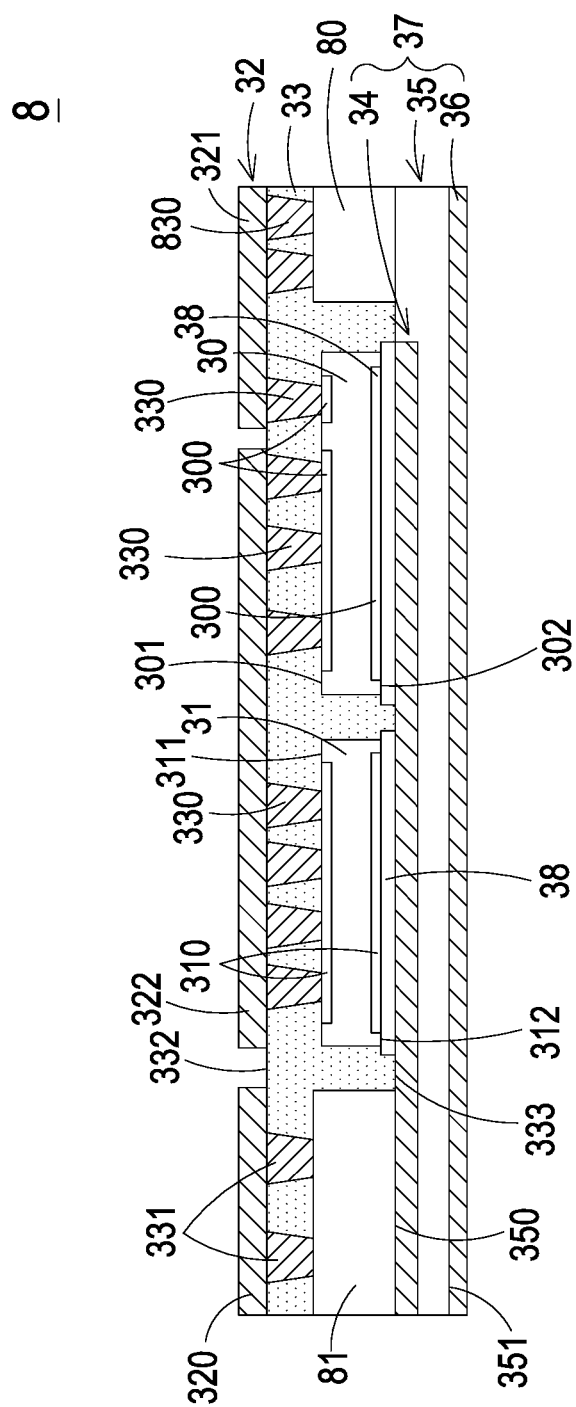
FIG. 8 is a schematic cross-sectional view illustrating a further exemplary first sub-module of the power module of FIG. 1.

FIG. 8 is a schematic cross-sectional view illustrating a further exemplary first sub-module of the power module of FIG. 1. As mentioned above, the second conductive layer 34, the second insulation layer 35 and the third conductive layer 36 of the first sub-module 3 of FIG. 4 are collaboratively defined as the direct bond copper assembly 37. In comparison with FIG. 4, the methods of forming the second conductive layer 34, the second insulation layer 35 and the third conductive layer 36 the first sub-module 8 of this embodiment are distinguished. As shown in FIG. 8, the second conductive layer 34 is electroplated on the bottom surface 333 of the first insulation layer 33, the second insulation layer 35 is laminated on the second conductive layer 34, and the third conductive layer 36 is electroplated on the second insulation layer 35. Moreover, the bottom surface 333 of the first insulation layer 33 is partially covered by the second conductive layer 34, the bottom surface 333 of the first insulation layer 33 is partially covered by the second insulation layer 35.

Moreover, the first sub-module 8 further comprises a first thermal conduction structure 80 and a second thermal conduction structure 81. The first thermal conduction structure 80 and the second thermal conduction structure 81 are embedded within the first insulation layer 33. The first thermal conduction structure 80 is located near the first semiconductor switch 30, disposed on the junction between the bottom surface 333 of the first insulation layer 33 and the second insulation layer 35, and partially exposed outside the first insulation layer 33. Consequently, the heat generated by the first semiconductor switch 30 may be transferred to the surroundings of the first sub-module 8 through the first thermal conduction structure 80. The second thermal conduction structure 81 is located near the first diode 31, disposed on the second conductive layer 34, and partially exposed outside the first insulation layer 33. Consequently, the heat generated by the first diode 31 may be transferred to the surroundings of the first sub-module 8 through the second thermal conduction structure 81.

In an embodiment, the first thermal conduction structure 80 and the second thermal conduction structure 81 are made of metallic material. Moreover, the first thermal conduction structure 80 and the second thermal conduction structure 81 may be implemented with the same lead frame or two different lead frames. Consequently, the first thermal conduction structure 80 and the second thermal conduction structure 81 have thermally conductive property and electrically conductive property. Moreover, the second ends of the second conductive vias 331 are contacted with the second thermal conduction structure 81. Consequently, the first conducting terminal 300 of the first semiconductor switch 30 in contact with the second conductive layer 34 and the second conducting terminal 310 of the first diode 31 in contact with the second conductive layer 34 are electrically connected with the first electrode 320 through the second conductive layer 34, the second thermal conduction structure 81 and the second conductive vias 331. Moreover, at least one auxiliary conductive via 830 is further formed in the first insulation layer 33. A first end of the auxiliary conductive via 830 is contacted with the second electrode 321. A second end of the auxiliary conductive via 830 is contacted with the first thermal conduction structure 80. After the heat generated by the first semiconductor switch 30 is transferred to the second electrode 321, the heat may be further transferred to the first thermal conduction structure 80 through the auxiliary conductive via 830. Under this circumstance, the heat dissipating efficiency is enhanced.

Figure 9:
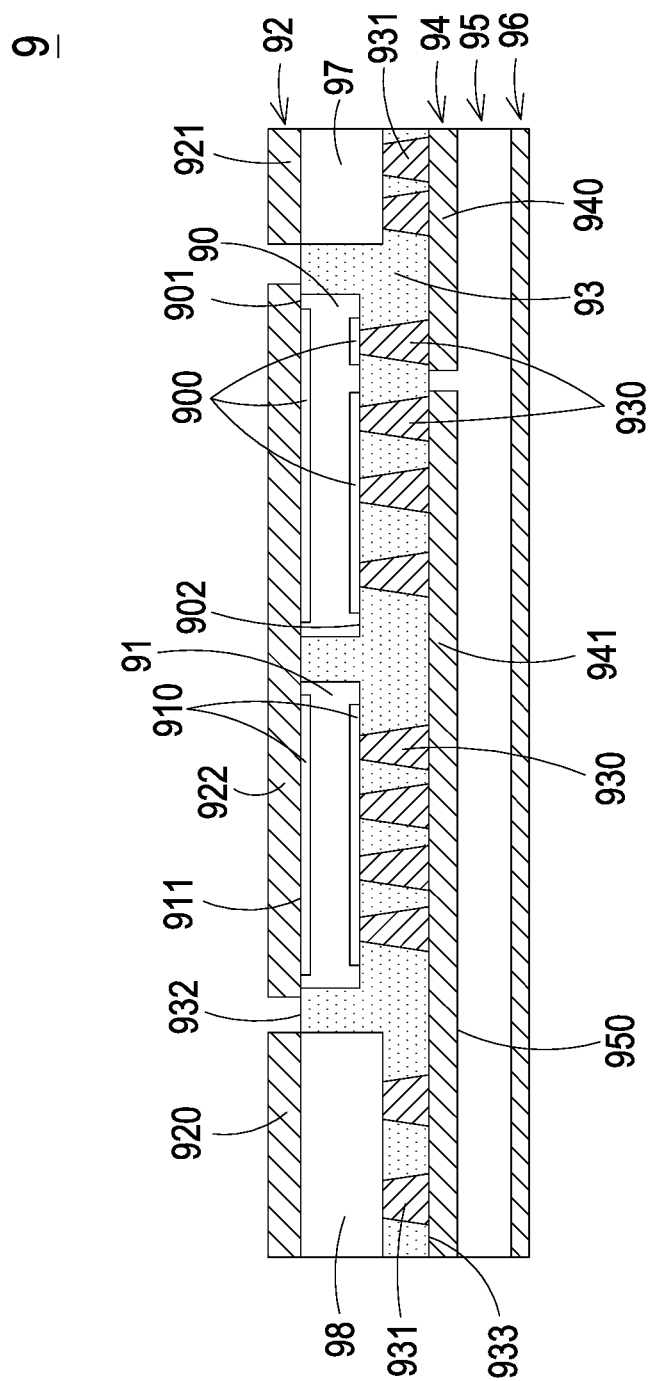
FIG. 9 is a schematic cross-sectional view illustrating a further exemplary second sub-module of the power module of FIG. 1.

FIG. 9 is a schematic cross-sectional view illustrating a further exemplary second sub-module of the power module of FIG. 1. The second sub-module 9 comprises a second semiconductor switch 90, a second diode 91, a fourth conductive layer 92, a third insulation layer 93, a fifth conductive layer 94, a fourth insulation layer 95, a sixth conductive layer 96, a first thermal conduction structure 97 and a second thermal conduction structure 98. Moreover, plural third conductive vias 930 and plural fourth conductive vias 931 are formed in the third insulation layer 93. The fourth conductive layer 92 is disposed on a top surface 932 of the third insulation layer 93. The fourth conductive layer 92 is divided into a fourth electrode 920, a fifth electrode 921 and a sixth electrode 922 by an etching process.

The fifth conductive layer 94 is electroplated on bottom surface 933 of the third insulation layer 93. Moreover, by an etching process, the fifth conductive layer 94 is divided into a first conductive block 940 and a second conductive block 941. The first conductive block 940 is contacted with the second ends of the corresponding third conductive vias 930 and contacted with the second ends of the corresponding fourth conductive vias 931. The second conductive block 941 is contacted with the second end of the corresponding third conductive via 930 and the second ends of the corresponding fourth conductive vias 931. The fourth insulation layer 95 is laminated on the fifth conductive layer 94. The sixth conductive layer 96 is electroplated on the fourth insulation layer 95.

The configurations and characteristics of the second semiconductor switch 90 are similar to those of the second semiconductor switch 40 of FIG. 5. The second semiconductor switch 90 comprises three third conducting terminals 900. The three third conducting terminals 900 serve as a gate, an emitter and a collector, respectively. The second semiconductor switch 90 is embedded within the third insulation layer 93. The third conducting terminals 900 serving as the gate and the emitter of the second semiconductor switch 90 are disposed on a bottom surface 902 of the second semiconductor switch 90. The third conducting terminal 900 serving as the gate of the second semiconductor switch 90 is contacted with the first end of the corresponding third conductive via 930 so as to be electrically connected with the first conductive block 940. The third conducting terminal 900 serving as the emitter of the second semiconductor switch 90 is contacted with the first ends of the corresponding third conductive vias 930 so as to be electrically connected with the second conductive block 941. The third conducting terminal 900 serving as the collector is disposed on a top surface 901 of the second semiconductor switch 90 and contacted with the sixth electrode 922.

Similarly, the second diode 91 is embedded within the third insulation layer 93. The fourth conducting terminal 910 on a top surface 911 of the second diode 91 serves as a cathode, and contacted with the sixth electrode 922. The fourth conducting terminal 910 on a bottom surface 912 of the second diode 91 serves as an anode, and contacted with the corresponding third conductive vias 930 so as to be electrically connected with the second conductive block 941.

The first thermal conduction structure 97 and the second thermal conduction structure 98 are embedded within the third insulation layer 93. The first thermal conduction structure 97 is located near the second semiconductor switch 90, contacted with the fifth electrode 921, and contacted with the first ends of the corresponding fourth conductive vias 931 so as to be electrically connected with the first conductive block 940. Moreover, the first thermal conduction structure 97 is partially exposed outside the first insulation layer 93. Consequently, the heat generated by the second semiconductor switch 90 may be transferred to the surroundings of the second sub-module 9 through the first thermal conduction structure 97. Moreover, the third conducting terminal 900 serving as the gate of the second semiconductor switch 90 is electrically connected with the fifth electrode 921 through the corresponding third conductive via 930, the first conductive block 940, the corresponding fourth conductive vias 931 and the first thermal conduction structure 97. The second thermal conduction structure 98 is located near the second diode 91, contacted with the fourth electrode 920, and contacted with the first ends of the corresponding fourth conductive vias 931 so as to be electrically connected with the second conductive block 941. Moreover, the second thermal conduction structure 98 is partially exposed outside the first insulation layer 93. Consequently, the heat generated by the second diode 91 may be transferred to the surroundings of the second sub-module 9 through the second thermal conduction structure 98. Moreover, the fourth conducting terminal 910 serving as the anode of the second diode 91 is electrically connected with the fourth electrode 920 through the corresponding third conductive vias 930, the second conductive block 941, the corresponding fourth conductive vias 931 and the second thermal conduction structure 98.

In an embodiment, the first thermal conduction structure 97 and the second thermal conduction structure 98 are made of metallic material. Moreover, the first thermal conduction structure 97 and the second thermal conduction structure 98 may be implemented with the same lead frame or two different lead frames. Consequently, the first thermal conduction structure 97 and the second thermal conduction structure 98 have thermally conductive property and electrically conductive property.

It is noted that numerous modifications and alterations of the power module 1 may be made while retaining the teachings of the invention. Hereinafter, some variant examples of the power module will be illustrated with reference to FIGS. 10~48. Component parts and elements corresponding to those of the first embodiment are designated by identical numeral references, and detailed descriptions thereof are omitted.

Figure 10:
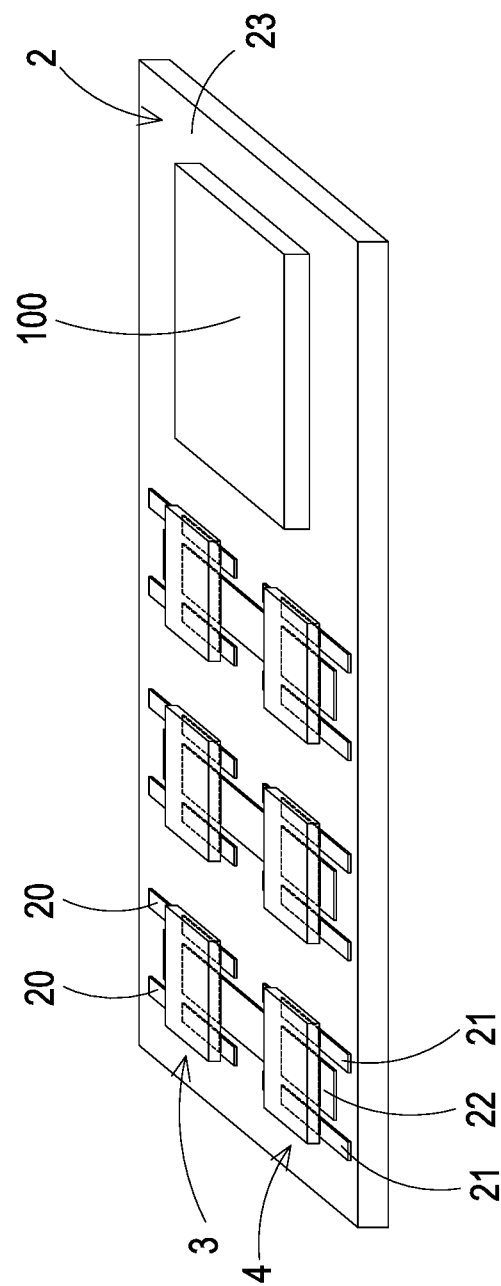
FIG. 10 is a schematic perspective view illustrating a power module according to a second embodiment of the present invention.

FIG. 10 is a schematic perspective view illustrating a power module according to a second embodiment of the present invention. In comparison with the power module 1 of FIG. 1, the power module 10 of this embodiment further comprises a controlling device 100 such as a controller or a driver. The controlling device 100 is disposed on the first surface 23 of the substrate 2. Moreover, the controlling device 100, the first sub-module 3 and the at least one second sub-module 4 are located at the same side of the substrate 2. The controlling device 100 is electrically connected with the high-voltage-side switching element (i.e. the first sub-module 3) and the low-voltage-side switching element (i.e. the second sub-module 4) through electrical traces (not shown) of the substrate 2 so as to control the on/off states of the high-voltage-side switching element and the low-voltage-side switching element.

Figure 11:
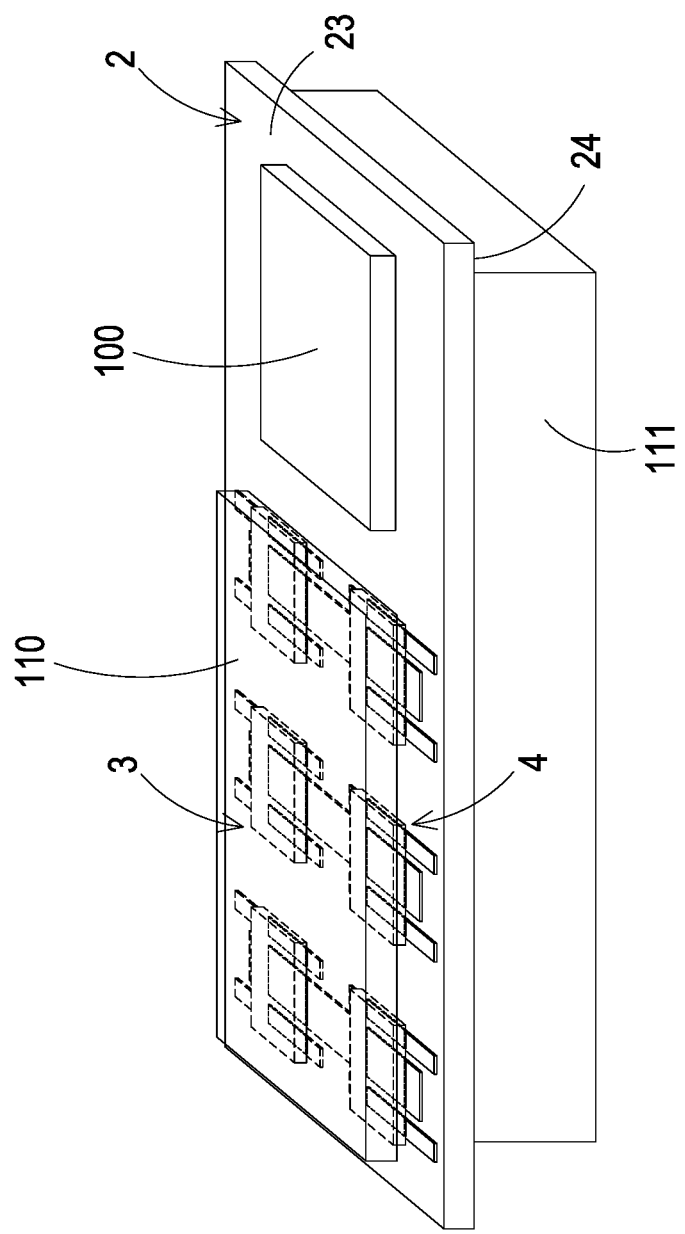
FIG. 11 is a schematic perspective view illustrating a power module according to a third embodiment of the present invention.

FIG. 11 is a schematic perspective view illustrating a power module according to a third embodiment of the present invention. In comparison with the power module 10 of FIG. 10, the power module 11 of this embodiment further comprises a first heat dissipation device 110 and/or a second heat dissipation device 111. The first heat dissipation device 110 is contacted with the first sub-module 3 and the second sub-module 4. That is, the first heat dissipation device 110 is contacted with the third conductive layer 36 of the first sub-module 3 and the sixth conductive layer 46 of the second sub-module 4 (see FIGS. 4 and 5). Consequently, the heat dissipating efficacy of the first sub-module 3 and the second sub-module 4 will be enhanced. The second heat dissipation device 111 is disposed on a second surface 24 of the substrate 2, which is opposed to the first surface 23 of the substrate 2. Consequently, the heat dissipating efficacy of the power module 11 will be further enhanced. Moreover, the heat generated by the power module 11 may be dissipated away along both sides through the first heat dissipation device 110 and the second heat dissipation device 111.

In an embodiment, each of the first heat dissipation device 110 and the second heat dissipation device 111 may be a passive heat dissipation device or an active heat dissipation device. An example of the passive heat dissipation device includes but is not limited to a heat sink, which is made of metallic material or ceramic material. An example of the active heat dissipation device includes but is not limited to cooling water or heat pipe.

In this embodiment, the first heat dissipation device 110 and the second heat dissipation device 111 are disposed on the substrate 2 of the power module 11 with the controlling device 100. It is noted that the first heat dissipation device 110 and the second heat dissipation device 111 may be included in the power module without the controlling device (e.g. the power module 1 of FIG. 1).

Figure 12:
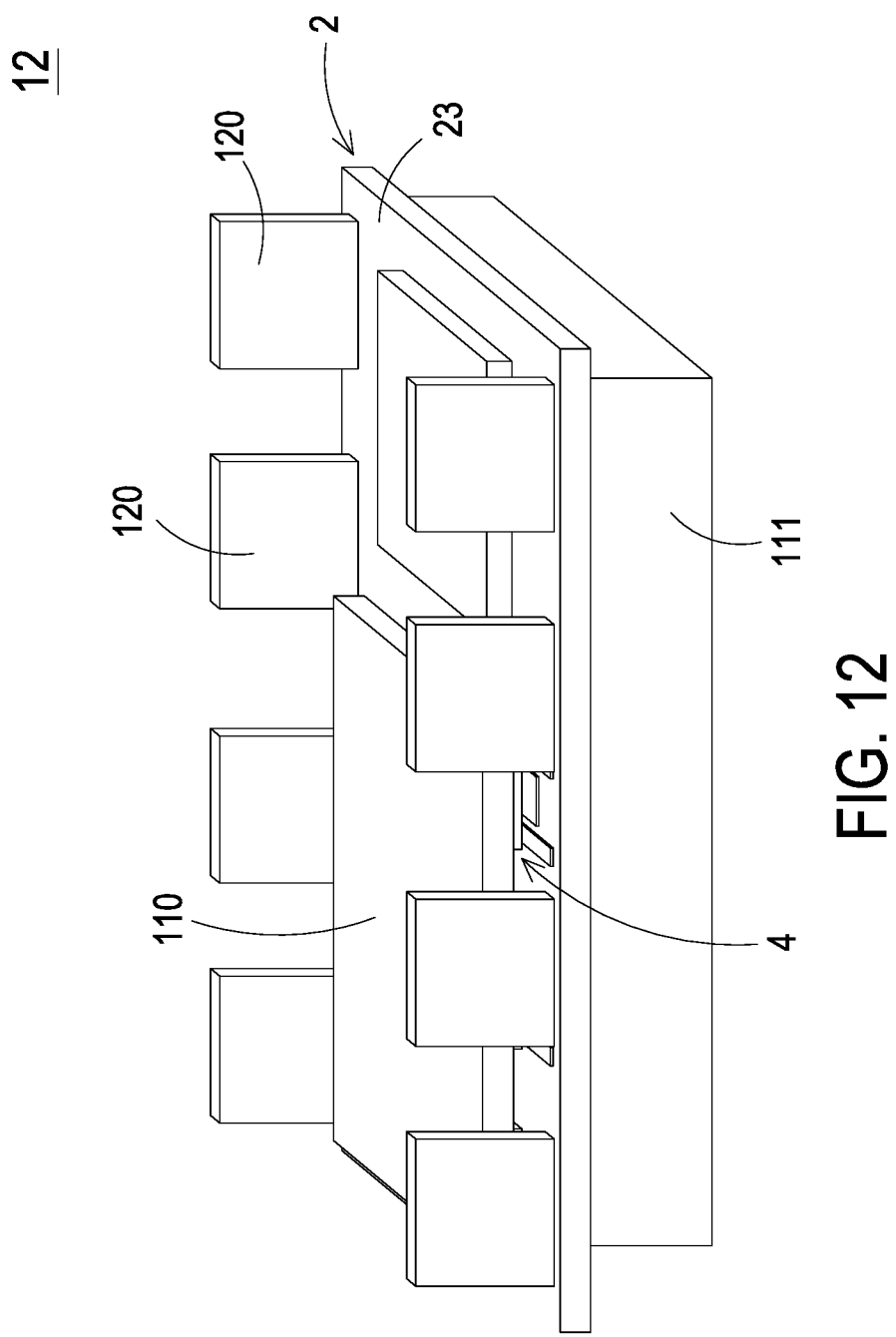
FIG. 12 is a schematic perspective view illustrating a power module according to a fourth embodiment of the present invention.

FIG. 12 is a schematic perspective view illustrating a power module according to a fourth embodiment of the present invention. In comparison with the power module 11 of FIG. 11, the power module 12 of this embodiment further comprises at least one pin 120. The pin 120 is made of metallic material, and disposed on an edge of the first surface 23 of the substrate 2. Moreover, the at least one pin 120, the first sub-module 3 and the second sub-module 4 are located at the same side of the substrate 2. The at least one pin 120 is mounted on the substrate 2 by a solder paste welding process, a ultrasonic welding process, a hot pressure welding process, an electric welding process or a mechanical embedding process. Through the at least one pin 120, the power module 12 may be welded on a system circuit board (not shown).

Figure 13:
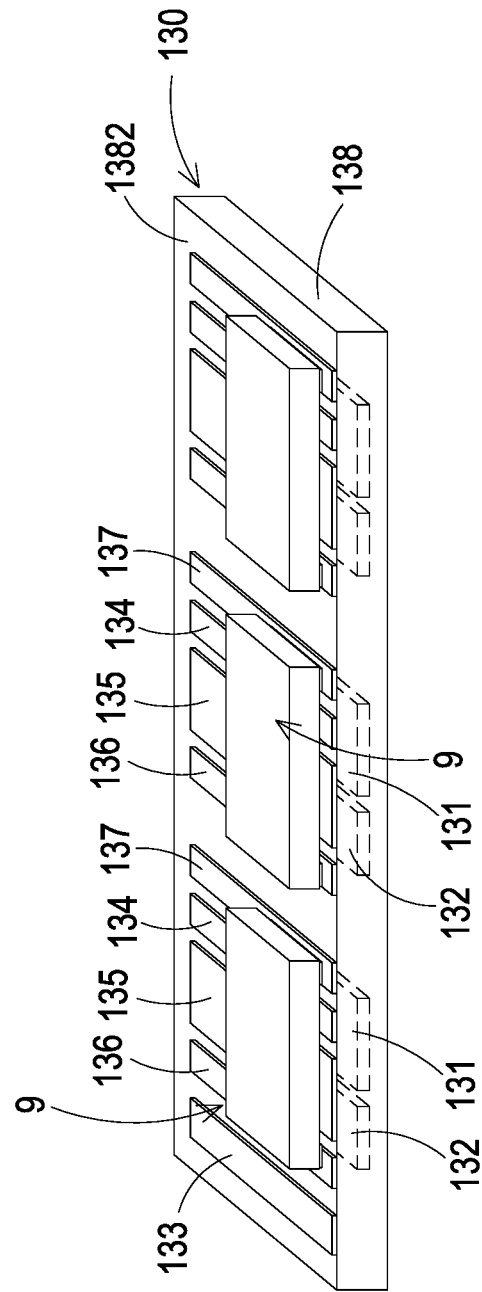
FIG. 13 is a schematic perspective view illustrating a power module according to a fifth embodiment of the present invention.
Figure 14:
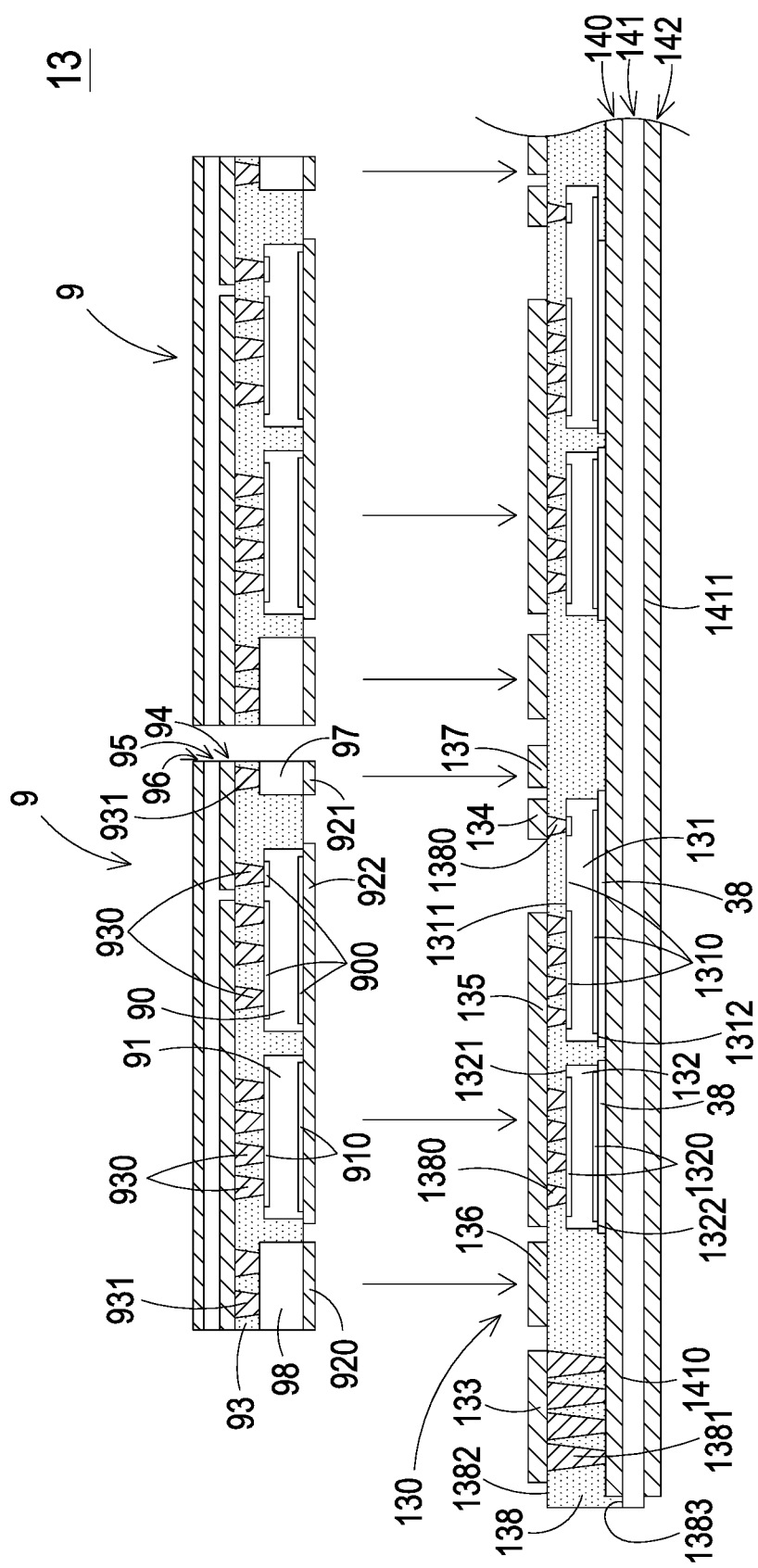
FIG. 14 is a schematic cross-sectional view illustrating the relationship between the first sub-module and the plural second sub-modules of the power module of FIG. 13.

FIG. 13 is a schematic perspective view illustrating a power module according to a fifth embodiment of the present invention. FIG. 14 is a schematic cross-sectional view illustrating the relationship between the first sub-module and the plural second sub-modules of the power module of FIG. 13. Please refer to FIGS. 13 and 14. The power module 13 comprises a first sub-module 130 and at least one second sub-module 9. The configurations of the second sub-module 9 of this embodiment are identical to those of the second sub-module 9 of FIG. 9. However, the second sub-module 9 of this embodiment is upside down. Component parts and elements corresponding to those of the second sub-module 9 of FIG. 9 are designated by identical numeral references, and detailed descriptions thereof are omitted.

The first sub-module 130 comprises at least one first semiconductor switch 131, at least one first diode 132, a first electrode 133, at least one second electrode 134, at least one third electrode 135, at least one first lead electrode 136, at least one second lead electrode 137 and a substrate 138. The power module 13 of this embodiment may also have the circuitry of the three-phase power converter of FIG. 3. When the power module 13 is applied to the three-phase power converter, the power module 13 comprises the first sub-module 130 and three second sub-modules 9. Under this circumstance, the first sub-module 130 comprises three first semiconductor switches 131, three first diodes 132, three second electrodes 134, three third electrodes 135, three first lead electrodes 136 and three second lead electrodes 137.

Each first semiconductor switch 131 and the corresponding first diode 132 are in a pair, and embedded within the substrate 138. Each first semiconductor switch 131 comprises plural first conducting terminals 1310. Each first diode 132 comprises plural second conducting terminals 1320. The first electrode 133, the second electrodes 134, the third electrodes 135, the first lead electrodes 136 and the second lead electrodes 137 are disposed on a top surface 1382 of the substrate 138. The first electrode 133 is electrically connected with the corresponding first conducting terminals 1310 of the first semiconductor switches 131. Each third electrode 135 is electrically connected with the corresponding first conducting terminal 1310 of the corresponding first semiconductor switch 131. The first electrode 133 is also electrically connected with the corresponding second conducting terminals 1320 of the first diodes 132. Each third electrode 135 is also electrically connected with the corresponding second conducting terminal 1320 of the corresponding first diode 132. Each second electrode 134 is electrically connected with the corresponding first conducting terminal 1310 of the corresponding first semiconductor switch 131. Each first lead electrode 136 is aligned with the fourth electrode 920 of the corresponding second sub-module 9. Each second lead electrode 137 is aligned with the fifth electrode 921 of the corresponding second sub-module 9.

For example, a first conductive layer is firstly electroplated on the top surface 1382 of the substrate 138. Then, the first conductive layer is divided into the first electrode 133, the second electrodes 134 and the third electrodes 135 by an etching process. An example of the first semiconductor switch 131 includes but is not limited to an insulated-gate bipolar transistor (IGBT). Consequently, the first semiconductor switch 131 comprises three first conducting terminals 1310. The three first conducting terminals 1310 serve as a gate, an emitter and a collector, respectively. The first electrode 133 is electrically connected with the collectors of the first semiconductor switches 131. The second electrode 134 is electrically connected with the gate of the corresponding first semiconductor switch 131. The third electrode 135 is electrically connected with the emitter of the corresponding first semiconductor switch 131.

The second sub-modules 9 are located at a first side of the first sub-module 130, and located near the top surface 1382 of the substrate 138. The fourth electrode 920 of the second sub-module 9 is contacted with the corresponding first lead electrode 136 of the first sub-module 130. The fifth electrode 921 of the second sub-module 9 is contacted with the corresponding second lead electrode 137 of the first sub-module 130. The sixth electrode 922 of the second sub-module 9 is contacted with the corresponding third electrode 135 of the first sub-module 130.

The first sub-module 130 further comprises a second conductive layer 140, a second insulation layer 141 and a third conductive layer 142. The second insulation layer 141 is disposed on a bottom surface 1383 of the substrate 138 and exposed outside the substrate 138. The second conductive layer 140 is disposed on a top surface 1410 of the second insulation layer 141 and embedded within the substrate 138. The third conductive layer 142 is disposed on a bottom surface 1411 of the second insulation layer 141. That is, the second conductive layer 140 and the third conductive layer 142 are located at two opposite sides of the second insulation layer 141.

Moreover, plural first conductive vias 1380 and at least one second conductive via 1381 are formed in the substrate 138. The first electrode 133 is contacted with the first end of the corresponding second conductive via 1381. The second electrode 134 and the third electrode 135 are contacted with the first ends of the corresponding first conductive vias 1380. The second conductive layer 140 is contacted with the second end of the corresponding second conductive via 1381, and electrically connected with the first electrode 133 through the corresponding second conductive via 1381. The first conducting terminals 1310 serving as the gate and the first conducting terminals 1310 serving as the emitter of the first semiconductor switch 1310 are disposed on a top surface 1311 of the first semiconductor switch 131. The first conducting terminals 1310 serving as the collector of the first semiconductor switch 131 is disposed on a bottom surface 1312 of the first semiconductor switch 131. Moreover, the gate of the first semiconductor switch 131 is contacted with a second end of the corresponding first conductive via 1380 so as to be electrically connected with the corresponding second electrode 134. The emitter of the first semiconductor switch 131 is contacted with the second ends of the corresponding first conductive vias 1380 so as to be electrically connected with the corresponding third electrode 135. The collector of the first semiconductor switch 131 is disposed on and electrically connected with the second conductive layer 140. Moreover, the collector of the first semiconductor switch 131 is electrically connected with the corresponding first electrode 133 through the second conductive layer 140 and the plural second conductive vias 1381. Moreover, the first semiconductor switch 131 is attached on the second conductive layer 140 through a fixing material 38.

Similarly, the first diode 132 may be attached on the second conductive layer 140 through the fixing material 38. The second conducting terminal 1320 on a top surface 1321 of the first diode 132 serves as an anode. Moreover, the anode of the first diode 132 is contacted with the second ends of the corresponding first conductive vias 1380 so as to be electrically connected with the third electrode 135. The second conducting terminal 1320 on a bottom surface 1322 of the first diode 132 serves as a cathode. Moreover, the cathode of the first diode 132 is disposed on the second conductive layer 140 and electrically connected with the first electrode 133 through the second conductive layer 140 and the plural second conductive vias 1381.

Moreover, each second sub-module 9 and the corresponding first semiconductor switch 131 and the corresponding first diode 132 of the first sub-module 130 are collaboratively defined as a leg of the bridge circuit. In particular, the second sub-module 9 is formed as a low-voltage-side switching element of the bridge circuit, and the corresponding first semiconductor switch 131 and the corresponding first diode 132 of the first sub-module 130 are formed as a high-voltage-side switching element of the bridge circuit.

As mentioned above, the first semiconductor switch 131 and corresponding first diode 132 are embedded within the substrate 138 of the first sub-module 130, and the second semiconductor switch 90 and the second diode 91 are embedded within the third insulation layer 93 of the second sub-module 9. Since the second sub-module 9 and the first sub-module 130 are located at different levels, the connection distance between the high-voltage-side switching element and the low-voltage-side switching element is effectively shortened. Under this circumstance, the on-resistance is effectively reduced, the parasitic effect is reduced, the electrical property is enhanced, and the overall power density of the power module 13 is increased.

Figure 15:
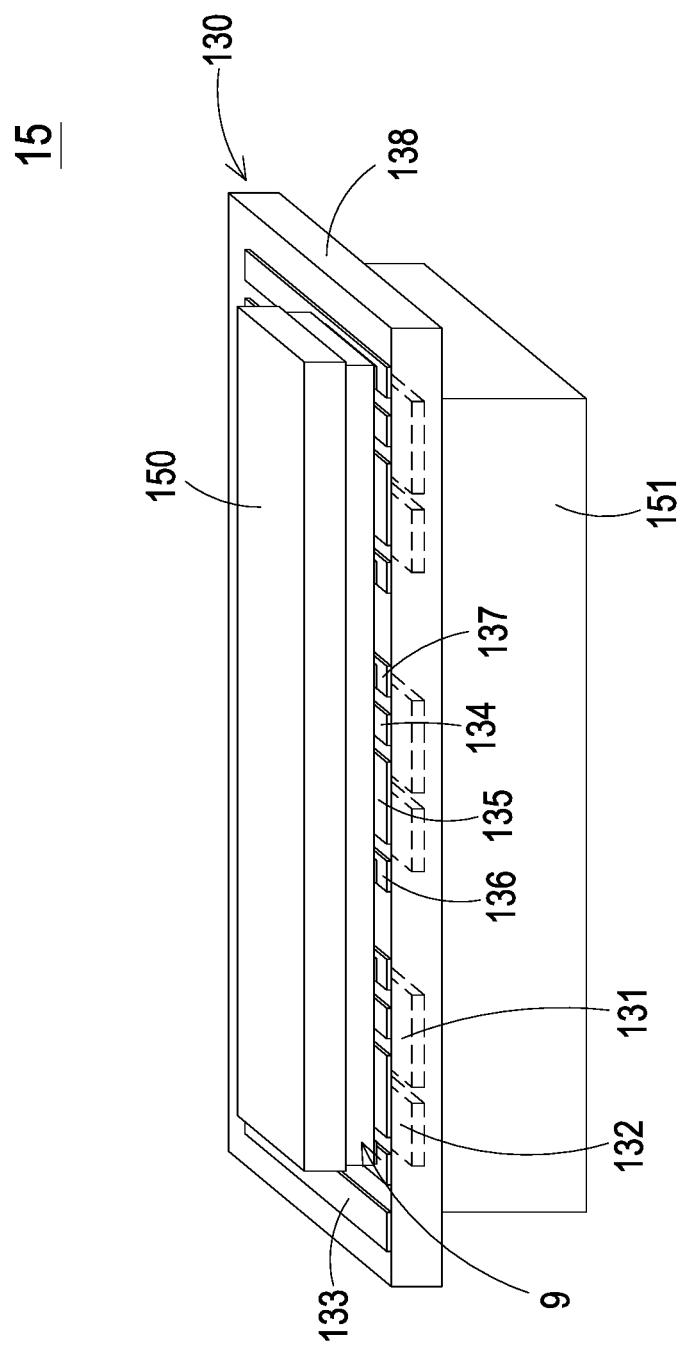
FIG. 15 is a schematic perspective view illustrating a power module according to a sixth embodiment of the present invention.

FIG. 15 is a schematic perspective view illustrating a power module according to a sixth embodiment of the present invention. In comparison with the power module 13 of FIG. 13, the power module 15 of this embodiment further comprises a first heat dissipation device 150 and/or a second heat dissipation device 151. The first heat dissipation device 150 is disposed on the top surfaces of the second sub-modules 9, and contacted with the sixth conductive layer 96 of the second sub-modules 9 (see FIG. 14). That is, the first heat dissipation device 150 is located at a first side of the power module 15. Consequently, the heat dissipating efficacy of the second sub-modules 9 will be enhanced. The second heat dissipation device 151 is disposed on a bottom surface of the first sub-module 130 and contacted with the third conductive layer 142 of the first sub-module 130 (see FIG. 14). Consequently, the heat dissipating efficacy of the first sub-module 130 will be enhanced.

In an embodiment, each of the first heat dissipation device 150 and the second heat dissipation device 151 may be a passive heat dissipation device or an active heat dissipation device. An example of the passive heat dissipation device includes but is not limited to a heat sink, which is made of metallic material or ceramic material. An example of the active heat dissipation device includes but is not limited to cooling water or heat pipe.

Figure 16:
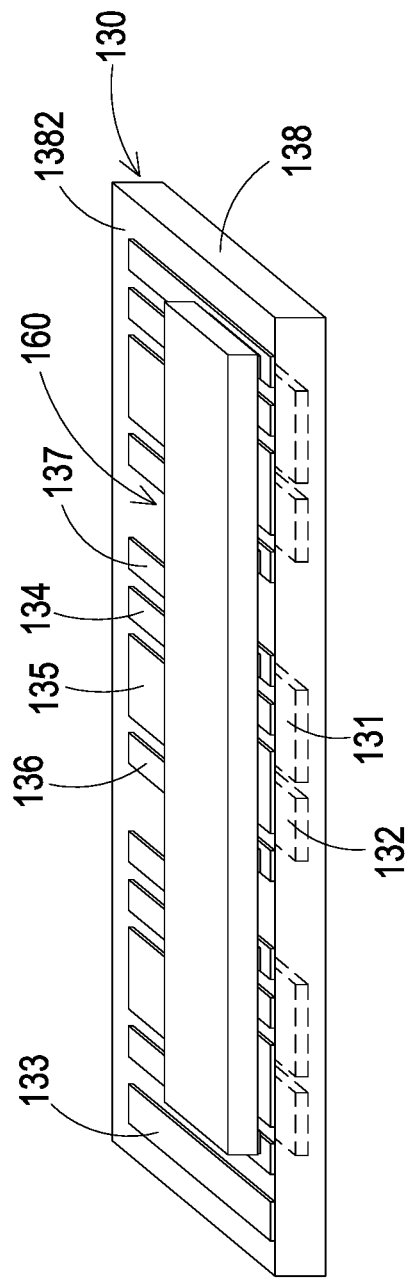
FIG. 16 is a schematic perspective view illustrating a power module according to a seventh embodiment of the present invention.
Figure 17:
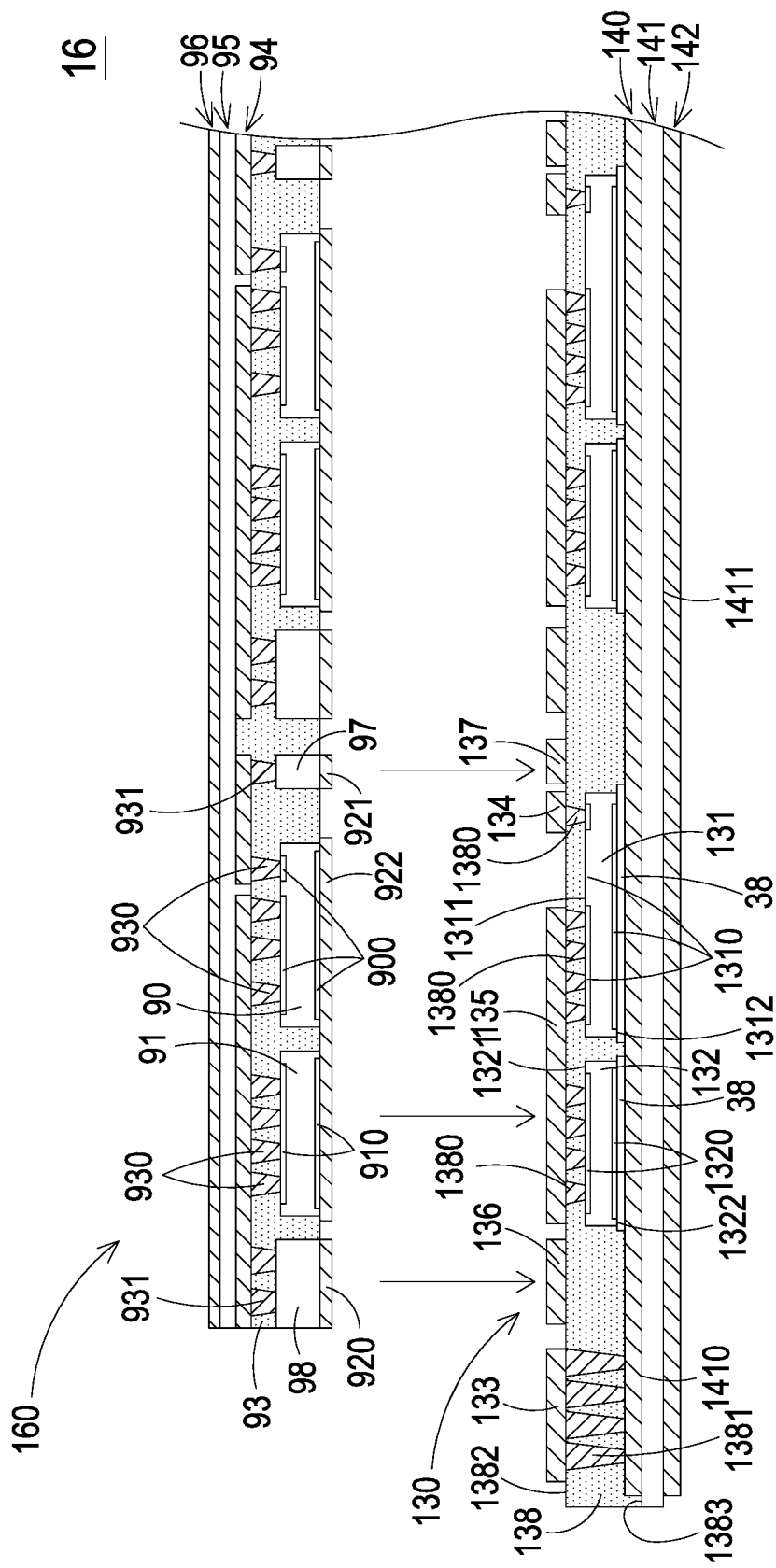
FIG. 17 is a schematic cross-sectional view illustrating the relationship between the first sub-module and the second sub-module of the power module of FIG. 16.

FIG. 16 is a schematic perspective view illustrating a power module according to a seventh embodiment of the present invention. FIG. 17 is a schematic cross-sectional view illustrating the relationship between the first sub-module and the second sub-module of the power module of FIG. 16. Please refer to FIGS. 16 and 17. In comparison with the power module 13 of FIG. 13, the power module 16 of this embodiment has a single second sub-module 160. That is, the plural second sub-modules 9 of the power module 13 of FIG. 13 are integrated into the single second sub-module 160. Component parts and elements corresponding to those of the power module 13 of FIG. 13 are designated by identical numeral references, and detailed descriptions thereof are omitted.

The second sub-module 160 comprises plural second semiconductor switches 90 and plural second diodes 91. Each second semiconductor switch 90 and the corresponding second diode 91 are collaboratively defined as a low-voltage-side switching element of one leg of a bridge circuit. The second sub-module 160 further comprises a fourth conductive layer 92, a third insulation layer 93, a fifth conductive layer 94, a fourth insulation layer 95, a sixth conductive layer 96, a first thermal conduction structure 97 and a second thermal conduction structure 98. The configurations of each second semiconductor switch 90, each second diode 91, the fourth conductive layer 92, the third insulation layer 93, the fifth conductive layer 94, the fourth insulation layer 95, the sixth conductive layer 96, the first thermal conduction structure 97 and the second thermal conduction structure 98 are the connecting relationships between these components are similar to those of the plural second sub-modules 9 of FIGS. 14 and 15, and are not redundantly described herein.

Moreover, the numbers of the first semiconductor switches 131, the first diodes 132, the second electrodes 134, the third electrodes 135, the first lead electrodes 136 and the second lead electrodes 137 of the first sub-module 130 and the fourth electrodes 920, the fifth electrodes 921 and the sixth electrodes 922 of the second sub-module 160 are identical to the numbers of the second semiconductor switches 90 and the second diodes 91 of the second sub-module 160.

Figure 18:
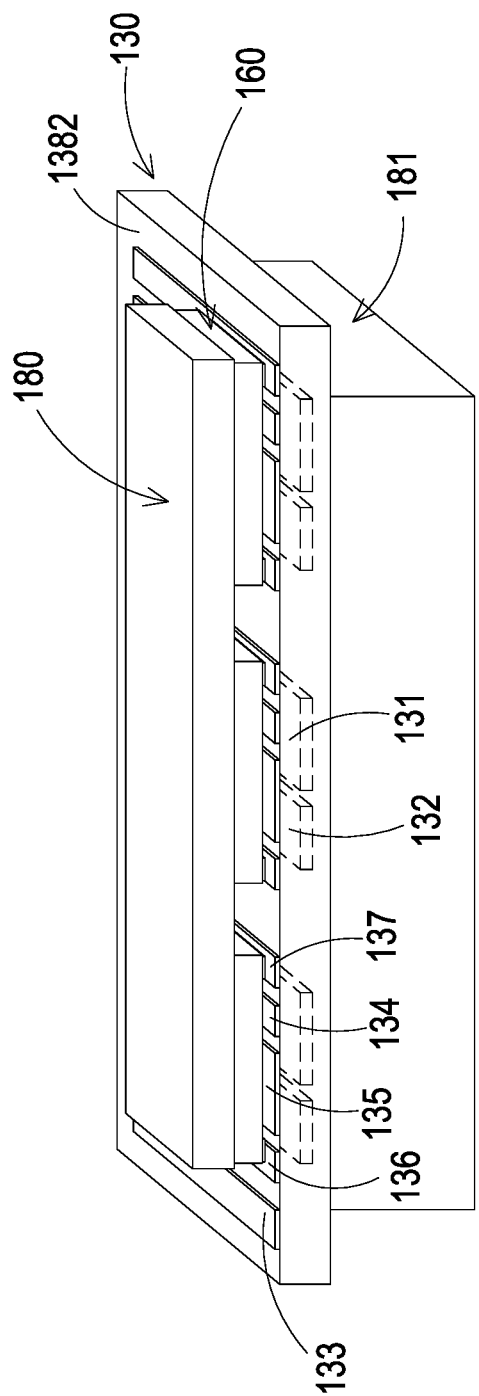
FIG. 18 is a schematic perspective view illustrating a power module according to an eighth embodiment of the present invention.

FIG. 18 is a schematic perspective view illustrating a power module according to an eighth embodiment of the present invention. In comparison with the power module 16 of FIG. 16, the power module 18 of this embodiment further comprises a first heat dissipation device 180 and/or a second heat dissipation device 181. The first heat dissipation device 180 is disposed on the top surfaces of the second sub-module 160, and contacted with the sixth conductive layer 96 of the second sub-modules 160 (see FIG. 17). That is, the first heat dissipation device 180 is located at a first side of the power module 18. Consequently, the heat dissipating efficacy of the second sub-modules 160 will be enhanced. The second heat dissipation device 181 is disposed on a bottom surface of the first sub-module 130 and contacted with the third conductive layer 142 of the first sub-module 130 (see FIG. 17). Consequently, the heat dissipating efficacy of the first sub-module 130 will be enhanced.

In an embodiment, each of the first heat dissipation device 180 and the second heat dissipation device 181 may be a passive heat dissipation device or an active heat dissipation device. An example of the passive heat dissipation device includes but is not limited to a heat sink, which is made of metallic material or ceramic material. An example of the active heat dissipation device includes but is not limited to cooling water or heat pipe.

From the above descriptions, the present invention provides the power module. The first semiconductor switch and the first diode are embedded within the first insulation layer. The second semiconductor switch and the second diode are embedded within the third insulation layer. Moreover, the first sub-module is formed as the high-voltage-side switching element, and the second sub-module is formed as the low-voltage-side switching element. The plural first conducting terminals of the first semiconductor switch and the plural second conducting terminals of the first diode are electrically connected with the corresponding electrodes of the first electrode, the second electrode and the third electrode of the first sub-module. The plural third conducting terminals of the second semiconductor switch and the plural fourth conducting terminals of the second diode are electrically connected with the corresponding electrodes of the fourth electrode, the fifth electrode and the sixth electrode of the second sub-module. When the first sub-module and the second sub-module are mounted on the substrate, the first electrode, the second electrode and the third electrode of the first sub-module and the fourth electrode, the fifth electrode and the sixth electrode of the second sub-module are contacted with the corresponding conducting parts of the first conducting parts, the second conducting parts and the third conducting part of the substrate. In other words, the first sub-module and the second sub-module may be electrically connected with each other and/or electrically connected with other electronic components through first conducting parts, the second conducting parts and the third conducting part of the substrate. Consequently the power module of the present invention has reduced parasitic inductance, increased switching efficiency, reduced impedance and increased power conversion efficiency. Moreover, since it is not necessary to retain a wire-bonded area on the substrate, the space utilization of the substrate is increased. Under this circumstance, the power density is enhanced. Moreover, since the first sub-module and the second sub-module are independently formed as the high-voltage-side switching elements and the low-voltage-side switching element, if the first sub-module or the second sub-module 4 has malfunction, the damaged sub-module may be replaced with a new one. After the damaged sub-module is replaced, the bridge circuit with the first sub-module and the second sub-module can be normally operated. Moreover, the first semiconductor switch and corresponding first diode of the high-voltage-side switching element may be directly embedded within the substrate and packaged as the first sub-module, and the second sub-module (i.e. the low-voltage-side switching element) may be disposed on the first sub-module. Since the second sub-module and the first sub-module are located at different levels, the connection distance between the high-voltage-side switching element and the low-voltage-side switching element is effectively shortened. Under this circumstance, the on-resistance is effectively reduced, the parasitic effect is reduced, the electrical property is enhanced, and the overall power density of the power module is increased. Moreover, if two heat dissipation devices are located at two opposite sides of the power module, the heat dissipating efficiency is enhanced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A power module, comprising:
   a substrate comprising plural first conducting parts, plural second conducting parts and at least one third conducting part;
   at least one first sub-module disposed on the substrate, wherein each of the at least one first sub-module comprises a first semiconductor switch, a first diode, a first electrode, a second electrode and a third electrode, wherein the first semiconductor switch comprises plural first conducting terminals, and the first diode comprises plural second conducting terminals, wherein the first electrode and the third electrode are electrically connected with corresponding ones of the first conducting terminals of the first semiconductor switch and electrically connected with corresponding ones of the second conducting terminals of the first diode, and the second electrode is electrically connected with a corresponding one of the first conducting terminals, wherein the first electrode and the second electrode are contacted with corresponding ones of the first conducting parts, and the third electrode is contacted with the at least one third conducting part; and
   at least one second sub-module disposed on the substrate, wherein each of the at least one second sub-module comprises a second semiconductor switch, a second diode, a fourth electrode, a fifth electrode and a sixth electrode, wherein the second semiconductor switch comprises plural third conducting terminals, and the second diode comprises plural fourth conducting terminals, wherein the fourth electrode and the sixth electrode are electrically connected with corresponding ones of the third conducting terminals of the second semiconductor switch and electrically connected with corresponding ones of the fourth conducting terminals of the second diode, and the fifth electrode is electrically connected with a corresponding one of the third conducting terminals, wherein the fourth electrode and the fifth electrode are contacted with the corresponding one of the second conducting parts, and the sixth electrode is contacted with the third conducting part.

2. The power module according to claim 1, wherein each of the at least one first sub-module is formed as a high-voltage-side switching element of a bridge circuit, and each of the at least one second sub-module is formed as a low-voltage-side switching element of the bridge circuit.

3. The power module according to claim 2, wherein the first semiconductor switch is an insulated-gate bipolar transistor, and the first semiconductor switch comprises three of the first conducting terminals, wherein the three of the first conducting terminals serve as a gate, an emitter and a collector, respectively, wherein the first electrode is electrically connected with the collector of the first semiconductor switch, the second electrode is electrically connected with the gate of the first semiconductor switch, and the third electrode is electrically connected with the emitter of the first semiconductor switch.

4. The power module according to claim 3, wherein each of the at least one first sub-module further comprises:
   a first insulation layer, wherein plural first conductive vias and plural second conductive vias are formed in the first insulation layer;
   a first conductive layer disposed on a top surface of the first insulation layer, and divided into the first electrode, the second electrode and the third electrode, wherein the first electrode is contacted with a first end of a corresponding one of the second conductive vias, and the second electrode and the third electrode are contacted with a first end of the corresponding one of the first conductive vias;
   a second insulation layer disposed on a bottom surface of the first insulation layer;
   a second conductive layer disposed on a top surface of the second insulation layer and embedded within the first insulation layer, wherein the second conductive layer is contacted with a second end of the corresponding second conductive via; and
   a third conductive layer disposed on a bottom surface of the second insulation layer.

5. The power module according to claim 4, wherein the first semiconductor switch and the first diode are embedded within the first insulation layer, wherein the first conducting terminal serving as the gate of the first semiconductor switch is contacted with the second end of the corresponding one of the first conductive vias so as to be electrically connected with the second electrode, the first conducting terminal serving as the emitter of the first semiconductor switch is contacted with the second end of the corresponding one of the first conductive vias so as to be electrically connected with the third electrode, and the corresponding one of the first conducting terminals serving as the collector of the first semiconductor switch is disposed on and electrically connected with the second conductive layer, wherein a first one of the second conducting terminals serving as an anode of the first diode is contacted with the second end of the corresponding one of first conductive vias so as to be electrically connected with the third electrode, and a second one of the second conducting terminals serving as a cathode of the first diode is disposed on and electrically connected with the second conductive layer.

6. The power module according to claim 5, wherein the second conductive layer further comprises a first cavity, wherein the first cavity is concavely formed in a top surface of the second conductive layer, and the first semiconductor switch and the first diode are accommodated within the first cavity.

7. The power module according to claim 6, wherein when the first semiconductor switch and the first diode are accommodated within the first cavity, a top surface of the first semiconductor switch and a top surface of the first diode are at a same level with the top surface of the second conductive layer.

8. The power module according to claim 4, wherein the second conductive layer, the second insulation layer and the third conductive layer are collaboratively defined as a direct bond copper assembly.

9. The power module according to claim 3, wherein each of the at least one first sub-module further comprises:
   a first insulation layer, wherein plural first conductive vias and at least one second conductive via are formed in the first insulation layer;
   a first conductive layer disposed on a top surface of the first insulation layer, and divided into the first electrode, the second electrode and the third electrode, wherein the first electrode is contacted with a first end of the at least one second conductive via, and the second electrode and the third electrode are contacted with a first end of a corresponding one of the first conductive vias;
   a second conductive layer electroplated on a bottom surface of the first insulation layer, and covering a first part of the bottom surface of the first insulation layer;
   a second insulation layer laminated on the second conductive layer, and covering a second part of the bottom surface of the first insulation layer; and
   a third conductive layer electroplated on a bottom surface of the second insulation layer.

10. The power module according to claim 9, wherein each of the at least one first sub-module further comprises:
    a first thermal conduction structure embedded within the first insulation layer, wherein the first thermal conduction structure is located near the first semiconductor switch, disposed on a junction between the bottom surface of the first insulation layer and the second insulation layer, and partially exposed outside the first insulation layer, so that heat generated by the first semiconductor switch is transferred to surroundings of each of the at least one first sub-module through the first thermal conduction structure; and
    a second thermal conduction structure embedded within the first insulation layer, wherein the second thermal conduction structure is located near the first diode, disposed on the second conductive layer, and partially exposed outside the first insulation layer, so that heat generated by the first diode is transferred to the surroundings of each of the at least one first sub-module through the second thermal conduction structure.

11. The power module according to claim 10, wherein the first thermal conduction structure and the second thermal conduction structure are made of metallic material, a second end of the second conductive via is contacted with the second thermal conduction structure, and at least one auxiliary conductive via is further formed in the first insulation layer, wherein a first end of the auxiliary conductive via is contacted with the second electrode, and a second end of the auxiliary conductive via is contacted with the first thermal conduction structure.

12. The power module according to claim 2, wherein the second semiconductor switch is an insulated-gate bipolar transistor, and the second semiconductor switch comprises three third conducting terminals, wherein the three third conducting terminals serve as a gate, an emitter and a collector, respectively, wherein the fourth electrode is electrically connected with the emitter of the second semiconductor switch, the fifth electrode is electrically connected with the gate of the second semiconductor switch, and the sixth electrode is electrically connected with the collector of the second semiconductor switch.

13. The power module according to claim 12, wherein each of the at least one second sub-module further comprises:
    a third insulation layer, wherein plural third conductive vias and plural fourth conductive vias are formed in the third insulation layer;
    a fourth conductive layer disposed on a top surface of the third insulation layer, and divided into the fourth electrode, the fifth electrode and the sixth electrode, wherein the fourth electrode and the fifth electrode are contacted with a first end of corresponding ones of the corresponding fourth conductive vias, and the sixth electrode is contacted with a first end of corresponding ones of the third conductive vias;
    a fourth insulation layer disposed on a bottom surface of the third insulation layer;
    a fifth conductive layer disposed on a top surface of the fourth insulation layer and embedded within the third insulation layer, wherein the fifth conductive layer is divided into a first conductive block and a second conductive block, wherein the first conductive block is contacted with a second end of the corresponding fourth conductive via so as to be electrically connected with the fourth electrode, and second conductive block is contacted with the second end of the corresponding ones of the fourth conductive vias so as to be electrically connected with the fifth electrode; and
    a sixth conductive layer disposed on a bottom surface of the fourth insulation layer.

14. The power module according to claim 13, wherein the second semiconductor switch and the second diode are embedded within the third insulation layer, wherein a first one of the third conducting terminals serving as the collector of the second semiconductor switch is contacted with the second end of the corresponding ones of the third conductive vias so as to be electrically connected with the sixth electrode, a second one of the third conducting terminals serving as the emitter of the second semiconductor switch is disposed on and electrically connected with the first conductive block, a third one of the third conducting terminals serving as the gate of the second semiconductor switch is disposed on and electrically connected with the second conductive block, wherein a first one of the fourth conducting terminals serving as a cathode of the second diode is contacted with the second end of the corresponding ones of the third conductive vias so as to be electrically connected with the sixth electrode, and a second one of the fourth conducting terminals serving as an anode of the second diode is disposed on and electrically connected with the first conductive block.

15. The power module according to claim 12, wherein each of the at least one second sub-module further comprises:
    a third insulation layer, wherein plural third conductive vias and plural fourth conductive vias are formed in the third insulation layer, wherein the second semiconductor switch and the second diode are embedded within the third insulation layer, wherein a first one of the third conducting terminals serving as the gate of the second semiconductor switch, a second one of the third conducting terminals serving as the emitter of the second semiconductor switch and a first one of the fourth conducting terminals serving as the anode of the second diode are contacted with a first end of the corresponding ones of third conductive vias;

a fourth conductive layer disposed on a top surface of the third insulation layer, and comprising the fourth electrode, the fifth electrode and the sixth electrode, wherein a third one of the third conducting terminals serving as the collector of the second semiconductor switch and a second one of the fourth conducting terminals serving as the cathode of the second diode are contacted with the sixth electrode;

a fifth conductive layer electroplated on a bottom surface of the third insulation layer, and divided into a first conductive block and a second conductive block, wherein the first conductive block is contacted with a second end of the corresponding ones of the third conductive vias so as to be electrically connected with the first one of the third conducting terminals serving as the gate of the second semiconductor switch, and the first conductive block is contacted with a second end of corresponding ones of the fourth conductive vias, wherein the second conductive block is contacted with the second end of the corresponding ones of the third conductive vias so as to be electrically connected with the second one of the third conducting terminals serving as the emitter of the second semiconductor switch, the second conductive block is contacted with the second end of the corresponding ones of the third conductive vias so as to be electrically connected with the first one of the fourth conducting terminals serving as the anode of the second diode, and the second conductive block is contacted with the second end of the corresponding ones of the fourth conductive vias;

a fourth insulation layer laminated on the fifth conductive layer;

a sixth conductive layer electroplated on the fourth insulation layer;

a first thermal conduction structure made of metallic material and embedded within the third insulation layer, wherein the first thermal conduction structure is located near the second semiconductor switch, contacted with the fifth electrode, contacted with a first end of the corresponding ones of the fourth conductive vias so as to be electrically connected with the first conductive block, and partially exposed outside the third insulation layer, so that heat generated by the second semiconductor switch is transferred to surroundings of each of the at least one second sub-module through the first thermal conduction structure; and a second thermal conduction structure made of metallic material and embedded within the third insulation layer, wherein the second thermal conduction structure is located near the second diode, contacted with the fourth electrode, contacted with the first end of the corresponding ones of the fourth conductive vias so as to be electrically connected with the second conductive block, and partially exposed outside the first insulation layer, so that heat generated by the second diode is transferred to the surroundings of each of the at least one second sub-module through the second thermal conduction structure.

16. The power module according to claim 2, further comprising a controlling device, which is disposed on a first surface of the substrate, wherein the controlling device, each of the at least one first sub-module and each of the at least one second sub-module are located at a same side of the substrate, wherein the controlling device is electrically connected with the high-voltage-side switching element and the low-voltage-side switching element for controlling on/off states of the high-voltage-side switching element and the low-voltage-side switching element.

17. The power module according to claim 16, further comprising at least one of a first heat dissipation device in contact with each of the at least one first sub-module and each of the at least one second sub-module, or a second heat dissipation device disposed on a second surface of the substrate, wherein the second surface of the substrate is opposed to the first surface of the substrate.

18. The power module according to claim 17, further comprising at least one pin, wherein the at least one pin is made of metallic material, and disposed on an edge of the first surface of the substrate.

* * * * *